(12) United States Patent
Im et al.

(10) Patent No.: US 9,705,041 B2
(45) Date of Patent: Jul. 11, 2017

(54) LIGHT EMITTING DEVICE PACKAGES AND METHODS OF FORMING THE SAME

(71) Applicant: Samsung Electronics Co., Ltd., Suwon-si (KR)

(72) Inventors: Sung Jun Im, Yongin-si (KR); Dong Hyun Cho, Hwaseong-si (KR); Jong Rak Sohn, Hwaseong-si (KR); Yong Min Kwon, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/186,540

(22) Filed: Feb. 21, 2014

(65) Prior Publication Data

US 2014/0246648 A1  Sep. 4, 2014

(30) Foreign Application Priority Data

Mar. 4, 2013  (KR) .......................... 10-2013-0023003

(51) Int. Cl.
*H01L 33/38*  (2010.01)
*H01L 33/62*  (2010.01)

(52) U.S. Cl.
CPC ............ *H01L 33/382* (2013.01); *H01L 33/62* (2013.01); *H01L 2224/13* (2013.01)

(58) Field of Classification Search
CPC .................................................. H01L 33/06
USPC ........................................................ 257/13
See application file for complete search history.

(56) References Cited

U.S. PATENT DOCUMENTS 6,611,002 B2    8/2003  Weeks et al.
7,202,505 B2 *  4/2007  Nurminen et al. ............. 257/81
7,491,974 B2 *  2/2009  Nagai et al. ..................... 257/79
8,110,421 B2 *  2/2012  Sugizaki et al. ................ 438/26
8,138,516 B2 *  3/2012  Unno .............................. 257/98
(Continued)

FOREIGN PATENT DOCUMENTS

KR    2009079066    7/2009
KR    2011099512    9/2011
(Continued)

OTHER PUBLICATIONS

Korean Office Action dated Sep. 16, 2014 issued in corresponding Korean Application No. 10-2013-0023003.

*Primary Examiner* — Jarrett Stark
*Assistant Examiner* — Charles N Ausar-El
(74) *Attorney, Agent, or Firm* — Onello & Mello, LLP

(57) ABSTRACT

A light emitting device package, comprises a light emitting structure having first and second electrodes insulated from each other; and a support structure. The support structure comprises: a first support electrode electrically connected to the first electrode of the light emitting structure; a second support electrode electrically connected to the second electrode of the light emitting structure, the second support electrode spaced apart from, and electrically insulated from, the first support electrode; and a support connection portion between the first support electrode and the second support electrode. The light emitting structure includes a protrusion portion that protrudes in a horizontal direction beyond a sidewall of at least one of the first support electrode and the second support electrode so that a void is present below the protrusion portion and above a plane extending from bottoms of the first and second support electrodes.

24 Claims, 18 Drawing Sheets

(56) References Cited

U.S. PATENT DOCUMENTS

| | | | |
|---|---|---|---|
| 8,236,584 B1 | 8/2012 | Chem et al. | |
| 8,492,789 B2* | 7/2013 | Hung et al. | 257/99 |
| 8,519,425 B2* | 8/2013 | Yada | 257/99 |
| 9,269,878 B2* | 2/2016 | Hwang | H01L 33/385 |
| 2002/0117681 A1 | 8/2002 | Weeks et al. | |
| 2006/0091409 A1 | 5/2006 | Epler et al. | |
| 2007/0284602 A1 | 12/2007 | Chitnis et al. | |
| 2008/0142817 A1 | 6/2008 | Ibbetson et al. | |
| 2010/0053930 A1* | 3/2010 | Kim et al. | 362/84 |
| 2010/0176415 A1* | 7/2010 | Lee et al. | 257/98 |
| 2011/0062469 A1 | 3/2011 | Camras et al. | |
| 2011/0220944 A1* | 9/2011 | Choi et al. | 257/98 |
| 2011/0241061 A1 | 10/2011 | Yu et al. | |
| 2011/0297980 A1* | 12/2011 | Sugizaki et al. | 257/98 |
| 2012/0199857 A1 | 8/2012 | Humpston et al. | |
| 2012/0205694 A1 | 8/2012 | Chern et al. | |
| 2012/0228650 A1 | 9/2012 | Chern et al. | |
| 2012/0299038 A1* | 11/2012 | Hwang et al. | 257/98 |
| 2013/0228744 A1* | 9/2013 | Kazama | 257/13 |
| 2013/0285011 A1* | 10/2013 | Kojima et al. | 257/13 |
| 2014/0014894 A1* | 1/2014 | Mohammed | H01L 33/62 257/13 |
| 2014/0183444 A1* | 7/2014 | Chen et al. | 257/13 |
| 2015/0179884 A1* | 6/2015 | Kang | H01L 33/60 257/98 |
| 2016/0049546 A1* | 2/2016 | Hwang | H01L 33/385 257/13 |

FOREIGN PATENT DOCUMENTS

| | | |
|---|---|---|
| KR | 2011113079 | 10/2011 |
| KR | 2012082898 | 7/2012 |
| KR | 2012092489 | 8/2012 |
| WO | 2011033406 | 3/2011 |

\* cited by examiner

LIGHT EMITTING DEVICE PACKAGES AND METHODS OF FORMING THE SAME

CROSS-REFERENCE TO RELATED APPLICATIONS

This application claims priority to Korean Patent Application No. 2013-0023003 filed on Mar. 4, 2013, in the Korean Intellectual Property Office, the disclosure of which is incorporated herein by reference.

BACKGROUND

Field

Embodiments of the present inventive concepts relate to a light emitting device packages and methods of forming the same.

Description of the Related Art

Light emitting diodes (LED) enjoy widespread use as a light source in consideration of the various advantages thereof. Among others, such advantages can include a low degree of power consumption, while providing a high degree of luminance. Recently, light emitting devices have been employed as backlight units in illumination devices and in large liquid crystal display (LCD) devices. A light emitting device is commonly provided as a package that can be readily installed in various devices such as a lighting device, or the like. As the use of LEDs has extended into various fields, it is desired that the overall size of the light emitting device packages be reduced to allow for a sufficient degree of freedom in the design of illumination devices for specific applications.

Further, in light emitting device packages, as the amount of injected current is increased, heat dissipation performance becomes increasingly important. Heightened heat dissipation performance is significant in fields in which high-output light emitting devices, such as general illumination devices and backlights for large LCDs, are required. Thus, research into a package substrate that allows for heat dissipation characteristics of a light emitting device to be enhanced without increasing manufacturing costs has been actively conducted.

SUMMARY

In one aspect, the present inventive concepts provide a light emitting device package that can be implemented as a micro-package to maximize a degree of freedom in designing a lighting device.

In another aspect, the present inventive concepts provide a light emitting device package having excellent heat dissipation characteristics, and methods of formation thereof.

In an aspect, a light emitting device package comprises: a light emitting structure having first and second electrodes insulated from each other; and a support structure, the light emitting structure on the support structure, the support structure comprising: a first support electrode electrically connected to the first electrode of the light emitting structure; a second support electrode electrically connected to the second electrode of the light emitting structure, the second support electrode spaced apart from, and electrically insulated from, the first support electrode; and a support connection portion between the first support electrode and the second support electrode, wherein the light emitting structure includes a protrusion portion that protrudes in a horizontal direction beyond a sidewall of at least one of the first support electrode and the second support electrode so that a void is present below the protrusion portion and above a plane extending from bottoms of the first and second support electrodes.

In some embodiments, the light emitting structure has a first width in the horizontal direction, and wherein the support structure has a second width in the horizontal direction and wherein the first width is greater than the second width.

In some embodiments, the light emitting structure includes a lens unit package on, and at sidewalls of, the light emitting structure, and wherein the lens unit package has a first width in the horizontal direction and wherein the support structure has a second width in the horizontal direction and wherein the first width is greater than the second width.

In some embodiments, the light emitting structure has a first width in a first horizontal direction, wherein the support structure has a second width in the first horizontal direction and wherein the second width is of a value that is in a range of about 0.65 to about 0.95 times the first width.

In some embodiments, the first and second support electrodes have a combined third width in a first horizontal direction, wherein the support connection portion has a fourth width in the first horizontal direction and wherein the combined third width is greater than the fourth width.

In some embodiments, the first and second support electrodes have a first height in a vertical direction and wherein the support connection portion has a second height in the vertical direction and wherein the first height is greater than the second height.

In some embodiments, the first and second support electrodes have a first height in a vertical direction and wherein the light emitting structure has a third height in the vertical direction and wherein the first height is greater than the third height.

In some embodiments, the first and second support electrodes are unitary between sidewalls thereof.

In some embodiments, the protrusion portion protrudes in a horizontal direction beyond outer sidewalls of both the first support electrode and the second support electrode.

In some embodiments, the support connection portion comprises a first material, and wherein a region at a sidewall of the at least one first and second support electrodes and below the protrusion portion is substantially devoid of the first material.

In some embodiments, the support connection portion comprises a first material, and wherein a region at a sidewall of the at least one first and second support electrodes and below the protrusion portion is partially devoid of the first material.

In some embodiments, the light emitting device package further comprises an insulating layer between inner sidewalls of the first and second support electrodes and the support connection portion.

In some embodiments, the light emitting device package further comprises an insulating layer at outer sidewalls of the first and second support electrodes.

In some embodiments, regions of outer sidewalls of the first and second support electrodes are devoid of a material coating.

In some embodiments, the first support electrode and the second support electrode extend in a first horizontal direction of extension and are parallel to each other in the first horizontal direction.

In some embodiments, the first support electrode and the second support electrode are substantially rectangular in horizontal cross section, and wherein at least two sidewalls of at least one of the first support electrode and the second support electrode are covered by the support connection portion.

In some embodiments, the first support electrode and the second support electrode have a tapered cross-section so that they are wider at a bottom portion distal the light emitting structure and narrower at a top portion proximal the light emitting structure.

In some embodiments, the support connection portion has a tapered cross-section that is wider at a top portion proximal the light emitting structure and narrower at a bottom portion distal the light emitting structure.

In some embodiments, at least one of the first support electrode and the second support electrode includes an extension portion, and wherein the support connection portion is on the extension portion.

In some embodiments, the light emitting structure comprises: a first semiconductor layer of a first conductivity type, the first semiconductor layer in electrical contact with the first electrode; an active layer on the first semiconductor layer; and a second semiconductor layer on the active layer, the second semiconductor layer of a second conductivity type that is different than the first conductivity type, the second semiconductor layer in electrical contact with the second electrode.

In some embodiments, the light emitting device package further comprises a wavelength conversion layer on the second semiconductor layer.

In some embodiments, the light emitting device package further comprises an electrode via extending in a vertical direction between the second electrode and the second semiconductor layer.

In some embodiments, the electrode via comprises multiple electrode vias extending in parallel in a vertical direction between the second electrode and the second semiconductor layer.

In some embodiments, the electrode via has a tapered cross-section so that it is wider at a bottom portion proximal the second electrode and narrower at a top portion thereof distal the second electrode.

In some embodiments, the light emitting structure comprises a light emitting nano-structure.

In some embodiments, the first and second electrodes of the light emitting structure are at a common surface thereof and on the support structure.

In an aspect, a light emitting device package, comprises: a light emitting structure having first and second electrodes insulated from each other; and a support structure, the light emitting structure on the support structure, the support structure comprising: a first support electrode electrically connected to the first electrode of the light emitting structure; a second support electrode electrically connected to the second electrode of the light emitting structure, the second support electrode spaced apart from, and electrically insulated from, the first support electrode; and a support connection portion between the first support electrode and the second support electrode, wherein the support structure protrudes from a bottom of the light emitting structure in a vertical direction so that a void is present below the light emitting structure and above a plane extending from bottoms of the first and second support electrodes.

In some embodiments, the light emitting structure has a first width in the horizontal direction, and wherein the support structure has a second width in the horizontal direction and wherein the first width is greater than the second width.

In some embodiments, the light emitting structure includes a lens unit package on, and at sidewalls of, the light emitting structure, and wherein the lens unit package has a first width in the horizontal direction and wherein the support structure has a second width in the horizontal direction and wherein the first width is greater than the second width.

In some embodiments, the light emitting structure has a first width in a first horizontal direction, wherein the support structure has a second width in the first horizontal direction and wherein the second width is of a value that is in a range of about 0.65 to about 0.95 times the first width.

In some embodiments, the first and second support electrodes have a combined third width in a first horizontal direction, wherein the support connection portion has a fourth width in the first horizontal direction and wherein the combined third width is greater than the fourth width.

In some embodiments, the first and second support electrodes have a first height in a vertical direction and wherein the support connection portion has a second height in the vertical direction and wherein the first height is greater than the second height.

In some embodiments, the first and second support electrodes have a first height in a vertical direction and wherein the light emitting structure has a third height in the vertical direction and wherein the first height is greater than the third height.

In some embodiments, the first and second support electrodes are unitary between sidewalls thereof.

In some embodiments, the protrusion portion protrudes in a horizontal direction beyond outer sidewalls of both the first support electrode and the second support electrode.

In some embodiments, the support connection portion comprises a first material, and wherein a region at a sidewall of the at least one first and second support electrodes and below the protrusion portion is substantially devoid of the first material.

In some embodiments, the support connection portion comprises a first material, and wherein a region at a sidewall of the at least one first and second support electrodes and below the protrusion portion is partially devoid of the first material.

In some embodiments, the light emitting device package further comprises an insulating layer between inner sidewalls of the first and second support electrodes and the support connection portion.

In some embodiments, the light emitting device package further comprises an insulating layer at outer sidewalls of the first and second support electrodes.

In some embodiments, regions of outer sidewalls of the first and second support electrodes are devoid of a material coating.

In some embodiments, the first support electrode and the second support electrode extend in a first horizontal direction of extension and are parallel to each other in the first horizontal direction.

In some embodiments, the first support electrode and the second support electrode are substantially rectangular in horizontal cross section, and wherein at least two sidewalls of at least one of the first support electrode and the second support electrode are covered by the support connection portion.

In some embodiments, the first support electrode and the second support electrode have a tapered cross-section so that they are wider at a bottom portion distal the light emitting structure and narrower at a top portion proximal the light emitting structure In some embodiments, the support connection portion has a tapered cross-section that is wider at a top portion proximal the light emitting structure and narrower at a bottom portion distal the light emitting structure.

In some embodiments, at least one of the first support electrode and the second support electrode includes an extension portion, and wherein the support connection portion is on the extension portion.

In some embodiments, the light emitting structure comprises: a first semiconductor layer of a first conductivity type, the first semiconductor layer in electrical contact with the first electrode; an active layer on the first semiconductor layer; and a second semiconductor layer on the active layer, the second semiconductor layer of a second conductivity type that is different than the first conductivity type, the second semiconductor layer in electrical contact with the second electrode.

In some embodiments, the light emitting device package further comprises a wavelength conversion layer on the second semiconductor layer.

In some embodiments, the light emitting device package further comprises an electrode via extending in a vertical direction between the second electrode and the second semiconductor layer.

In some embodiments, the electrode via comprises multiple electrode vias extending in parallel in a vertical direction between the second electrode and the second semiconductor layer.

In some embodiments, the electrode via has a tapered cross-section so that it is wider at a bottom portion proximal the second electrode and narrower at a top portion thereof distal the second electrode.

In some embodiments, the light emitting structure comprises a light emitting nano-structure.

In some embodiments, the first and second electrodes of the light emitting structure are at a common surface thereof and on the support structure.

In an aspect, a light emitting device package, comprises: a light emitting structure having first and second electrodes insulated from each other; and a support structure, the light emitting structure on the support structure, the support structure comprising: a first support electrode electrically connected to the first electrode of the light emitting structure; a second support electrode electrically connected to the second electrode of the light emitting structure, the second support electrode spaced apart from, and electrically insulated from, the first support electrode; and a support connection portion between the first support electrode and the second support electrode, wherein the light emitting structure has a first width in a first horizontal direction, and wherein the support structure has a second width in the first horizontal direction and wherein the first width is greater than the second width.

In some embodiments, the light emitting structure includes a lens unit package on, and at sidewalls of, the light emitting structure, and wherein the lens unit package has a first width in the horizontal direction and wherein the support structure has a second width in the horizontal direction and wherein the first width is greater than the second width.

In some embodiments, the second width is of a value that is in a range of about 0.65 to about 0.95 times the first width.

In some embodiments, the first and second support electrodes have a combined third width in the first horizontal direction, wherein the support connection portion has a fourth width in the first horizontal direction and wherein the combined third width is greater than the fourth width.

In some embodiments, the first and second support electrodes have a first height in a vertical direction and wherein the support connection portion has a second height in the vertical direction and wherein the first height is greater than the second height.

In some embodiments, the first and second support electrodes have a first height in a vertical direction and wherein the light emitting structure has a third height in the vertical direction and wherein the first height is greater than the third height.

In some embodiments, the first and second support electrodes are unitary between sidewalls thereof.

In some embodiments, the protrusion portion protrudes in a horizontal direction beyond outer sidewalls of both the first support electrode and the second support electrode.

In some embodiments, the support connection portion comprises a first material, and wherein a region at a sidewall of the at least one first and second support electrodes and below the protrusion portion is substantially devoid of the first material.

In some embodiments, the support connection portion comprises a first material, and wherein a region at a sidewall of the at least one first and second support electrodes and below the protrusion portion is partially devoid of the first material.

In some embodiments, the light emitting device package further comprises an insulating layer between inner sidewalls of the first and second support electrodes and the support connection portion.

In some embodiments, the light emitting device package further comprises an insulating layer at outer sidewalls of the first and second support electrodes.

In some embodiments, regions of outer sidewalls of the first and second support electrodes are devoid of a material coating.

In some embodiments, the first support electrode and the second support electrode extend in a first horizontal direction of extension and are parallel to each other in the first horizontal direction.

In some embodiments, the first support electrode and the second support electrode are substantially rectangular in horizontal cross section, and wherein at least two sidewalls of at least one of the first support electrode and the second support electrode are covered by the support connection portion.

In some embodiments, the first support electrode and the second support electrode have a tapered cross-section so that they are wider at a bottom portion distal the light emitting structure and narrower at a top portion proximal the light emitting structure.

In some embodiments, the support connection portion has a tapered cross-section that is wider at a top portion proximal the light emitting structure and narrower at a bottom portion distal the light emitting structure.

In some embodiments, at least one of the first support electrode and the second support electrode includes an extension portion, and wherein the support connection portion is on the extension portion.

In some embodiments, the light emitting structure comprises: a first semiconductor layer of a first conductivity type, the first semiconductor layer in electrical contact with the first electrode; an active layer on the first semiconductor layer; and a second semiconductor layer on the active layer, the second semiconductor layer of a second conductivity type that is different than the first conductivity type, the second semiconductor layer in electrical contact with the second electrode.

In some embodiments, the light emitting device package further comprises a wavelength conversion layer on the second semiconductor layer.

In some embodiments, the light emitting device package further comprises an electrode via extending in a vertical direction between the second electrode and the second semiconductor layer.

In some embodiments, the electrode via comprises multiple electrode vias extending in parallel in a vertical direction between the second electrode and the second semiconductor layer.

In some embodiments, the electrode via has a tapered cross-section so that it is wider at a bottom portion proximal the second electrode and narrower at a top portion thereof distal the second electrode.

In some embodiments, the light emitting structure comprises a light emitting nano-structure.

In some embodiments, the first and second electrodes of the light emitting structure are at a common surface thereof and on the support structure.

In an aspect, a light emitting device package, comprises a light emitting structure having first and second electrodes insulated from each other; and a support structure, the light emitting structure on the support structure, the support structure comprising: a first support electrode electrically connected to the first electrode of the light emitting structure; a second support electrode electrically connected to the second electrode of the light emitting structure, the second support electrode spaced apart from, and electrically insulated from, the first support electrode; and a support connection portion between the first support electrode and the second support electrode, wherein the first and second support electrodes have a combined first width in a first horizontal direction at a widest portion of the support electrodes, wherein the support connection portion has a second width in the first horizontal direction and wherein the combined first width is greater than the second width.

In some embodiments, the light emitting structure has a third width in the horizontal direction, and wherein the support structure has a fourth width in the horizontal direction and wherein the third width is greater than the fourth width.

In some embodiments, the light emitting structure includes a lens unit package on, and at sidewalls of, the light emitting structure, and wherein the lens unit package has a third width in the horizontal direction and wherein the support structure has a fourth width in the horizontal direction and wherein the third width is greater than the fourth width.

In some embodiments, the light emitting structure has a third width in a first horizontal direction, wherein the support structure has a fourth width in the first horizontal direction and wherein the third width is of a value that is in a range of about 0.65 to about 0.95 times the fourth width.

In some embodiments, the first and second support electrodes have a first height in a vertical direction and wherein the support connection portion has a second height in the vertical direction and wherein the first height is greater than the second height.

In some embodiments, the first and second support electrodes have a first height in a vertical direction and wherein the light emitting structure has a third height in the vertical direction and wherein the first height is greater than the third height.

In some embodiments, the first and second support electrodes are unitary between sidewalls thereof.

In some embodiments, the protrusion portion protrudes in a horizontal direction beyond outer sidewalls of both the first support electrode and the second support electrode.

In some embodiments, the support connection portion comprises a first material, and wherein a region at a sidewall of the at least one first and second support electrodes and below the protrusion portion is substantially devoid of the first material.

In some embodiments, the support connection portion comprises a first material, and wherein a region at a sidewall of the at least one first and second support electrodes and below the protrusion portion is partially devoid of the first material.

In some embodiments, the light emitting device package further comprises an insulating layer between inner sidewalls of the first and second support electrodes and the support connection portion.

In some embodiments, the light emitting device package further comprises an insulating layer at outer sidewalls of the first and second support electrodes.

In some embodiments, wherein regions of outer sidewalls of the first and second support electrodes are devoid of a material coating.

In some embodiments, the first support electrode and the second support electrode extend in a first horizontal direction of extension and are parallel to each other in the first horizontal direction.

In some embodiments, the first support electrode and the second support electrode are substantially rectangular in horizontal cross section, and wherein at least two sidewalls of at least one of the first support electrode and the second support electrode are covered by the support connection portion.

In some embodiments, the first support electrode and the second support electrode have a tapered cross-section so that they are wider at a bottom portion distal the light emitting structure and narrower at a top portion proximal the light emitting structure.

In some embodiments, the support connection portion has a tapered cross-section that is wider at a top portion proximal the light emitting structure and narrower at a bottom portion distal the light emitting structure.

In some embodiments, at least one of the first support electrode and the second support electrode includes an extension portion, and wherein the support connection portion is on the extension portion.

In some embodiments, the light emitting structure comprises a first semiconductor layer of a first conductivity type, the first semiconductor layer in electrical contact with the first electrode; an active layer on the first semiconductor layer; and a second semiconductor layer on the active layer, the second semiconductor layer of a second conductivity type that is different than the first conductivity type, the second semiconductor layer in electrical contact with the second electrode.

In some embodiments, the light emitting device package further comprises a wavelength conversion layer on the second semiconductor layer.

In some embodiments, the light emitting device package further comprises an electrode via extending in a vertical direction between the second electrode and the second semiconductor layer.

In some embodiments, the electrode via comprises multiple electrode vias extending in parallel in a vertical direction between the second electrode and the second semiconductor layer.

In some embodiments, the electrode via has a tapered cross-section so that it is wider at a bottom portion proximal the second electrode and narrower at a top portion thereof distal the second electrode.

In some embodiments, the light emitting structure comprises a light emitting nano-structure.

In some embodiments, the first and second electrodes of the light emitting structure are at a common surface thereof and on the support structure.

In some embodiments, the light emitting structure includes a protrusion portion that protrudes in a horizontal direction beyond a sidewall of at least one of the first support electrode and the second support electrode so that a void is present below the protrusion portion and above a plane extending from bottoms of the first and second support electrodes.

In an aspect, a light emitting device package comprises: a light emitting structure having first and second electrodes insulated from each other; and a support structure, the light emitting structure on the support structure, the support structure comprising: a first support electrode electrically connected to the first electrode of the light emitting structure; a second support electrode electrically connected to the second electrode of the light emitting structure, the second support electrode spaced apart from, and electrically insulated from, the first support electrode; and a support connection portion between the first support electrode and the second support electrode, wherein the first and second support electrodes are unitary between sidewalls thereof.

In some embodiments, the light emitting structure includes a protrusion portion that protrudes in a horizontal direction beyond a sidewall of at least one of the first support electrode and the second support electrode so that a void is present below the protrusion portion and above a plane extending from bottoms of the first and second support electrodes.

In some embodiments, the light emitting structure has a first width in the horizontal direction, and wherein the support structure has a second width in the horizontal direction and wherein the first width is greater than the second width.

In some embodiments, the light emitting structure includes a lens unit package on, and at sidewalls of, the light emitting structure, and wherein the lens unit package has a first width in the horizontal direction and wherein the support structure has a second width in the horizontal direction and wherein the first width is greater than the second width.

In some embodiments, the light emitting structure has a first width in a first horizontal direction, wherein the support structure has a second width in the first horizontal direction and wherein the second width is of a value that is in a range of about 0.65 to about 0.95 times the first width.

In some embodiments, wherein the first and second support electrodes have a combined first width in a first horizontal direction, wherein the support connection portion has a second width in the first horizontal direction and wherein the combined first width is greater than the second width.

In some embodiments, the first and second support electrodes have a first height in a vertical direction and wherein the support connection portion has a second height in the vertical direction and wherein the first height is greater than the second height.

In some embodiments, the first and second support electrodes have a first height in a vertical direction and wherein the light emitting structure has a third height in the vertical direction and wherein the first height is greater than the third height.

In some embodiments, the protrusion portion protrudes in a horizontal direction beyond outer sidewalls of both the first support electrode and the second support electrode.

In some embodiments, the support connection portion comprises a first material, and wherein a region at a sidewall of the at least one first and second support electrodes and below the protrusion portion is substantially devoid of the first material.

In some embodiments, the support connection portion comprises a first material, and wherein a region at a sidewall of the at least one first and second support electrodes and below the protrusion portion is partially devoid of the first material.

In some embodiments, the light emitting device package further comprises an insulating layer between inner sidewalls of the first and second support electrodes and the support connection portion.

In some embodiments, the light emitting device package further comprises an insulating layer at outer sidewalls of the first and second support electrodes.

In some embodiments, regions of outer sidewalls of the first and second support electrodes are devoid of a material coating.

In some embodiments, the first support electrode and the second support electrode extend in a first horizontal direction of extension and are parallel to each other in the first horizontal direction.

In some embodiments, the first support electrode and the second support electrode are substantially rectangular in horizontal cross section, and wherein at least two sidewalls of at least one of the first support electrode and the second support electrode are covered by the support connection portion.

In some embodiments, the first support electrode and the second support electrode have a tapered cross-section so that they are wider at a bottom portion distal the light emitting structure and narrower at a top portion proximal the light emitting structure.

In some embodiments, the support connection portion has a tapered cross-section that is wider at a top portion proximal the light emitting structure and narrower at a bottom portion distal the light emitting structure.

In some embodiments, at least one of the first support electrode and the second support electrode includes an extension portion, and wherein the support connection portion is on the extension portion.

In some embodiments, the light emitting structure comprises: a first semiconductor layer of a first conductivity type, the first semiconductor layer in electrical contact with the first electrode; an active layer on the first semiconductor layer; and a second semiconductor layer on the active layer, the second semiconductor layer of a second conductivity type that is different than the first conductivity type, the second semiconductor layer in electrical contact with the second electrode.

In some embodiments, the light emitting device package further comprises a wavelength conversion layer on the second semiconductor layer.

In some embodiments, the light emitting device package further comprises an electrode via extending in a vertical direction between the second electrode and the second semiconductor layer.

In some embodiments, the electrode via comprises multiple electrode vias extending in parallel in a vertical direction between the second electrode and the second semiconductor layer.

In some embodiments, the electrode via has a tapered cross-section so that it is wider at a bottom portion proximal the second electrode and narrower at a top portion thereof distal the second electrode.

In some embodiments, the light emitting structure comprises a light emitting nano-structure.

In some embodiments, the first and second electrodes of the light emitting structure are at a common surface thereof and on the support structure.

In an aspect, a method of fabricating a light emitting device package comprises: providing a first wafer including a plurality of light emitting structures having first and second electrodes insulated from each other; and providing a second wafer including a plurality of support structures, each support structure including first and second support electrodes separated by a first support connection portion, neighboring support structures being separated by a second connection portion, the first and second support electrodes of the second wafer being electrically connected to corresponding first and second electrodes of the light emitting structures of the first wafer; at least partially removing the second support connection portions between neighboring support structures; and following at least partially removing the second connection portions, physically separating neighboring corresponding light emitting devices and support structures from each other.

In some embodiments, providing the second wafer comprises: providing a second wafer comprising a connection substrate; bonding the second wafer comprising the connection substrate to the first wafer with a bonding layer; patterning the connection substrate to form first and second support electrode openings that expose the first and second electrodes of the light emitting structures; and filling the first and second support electrode openings with a conductive material to form the first and second support electrodes.

In some embodiments, the method further comprises, prior to forming the first and second support electrodes, providing an insulating layer on inner sidewalls of the first and second support electrode openings.

In some embodiments, at least partially removing the second support connection portions between neighboring support structures comprises: applying a mask pattern to cover the first and second support electrodes and the first support connection portions; and at least partially removing the second support connection portions between neighboring support structures using the mask pattern as a mask.

In some embodiments, at least partially removing the second support connection portions between neighboring support structures comprises removing substantially all of the second connection portions.

In some embodiments, the method further comprises, following removing substantially all of the second connection portions, forming openings between neighboring light emitting structures, and then physically separating the neighboring corresponding light emitting devices and support structures.

In an aspect, a method of fabricating a light emitting device package comprises: providing a first wafer including a plurality of light emitting structures having first and second electrodes insulated from each other; providing a second wafer comprising a support substrate, a plurality of support structures being formed in the support substrate, each support structure including first and second support electrodes separated by a first support connection portion, neighboring support structures being separated by a second support connection portion; bonding the second wafer comprising the support substrate and the first and second support electrodes to the first wafer with a bonding layer and bonding the plurality of support structures to the plurality of light emitting structures of the first wafer so that first and second support electrodes of the second wafer are electrically connected to corresponding first and second electrodes of the light emitting structures of the first wafer; at least partially removing the second support connection portions between neighboring support structures; and following at least partially removing the second support connection portions, physically separating neighboring corresponding light emitting devices and support structures from each other.

In some embodiments, providing the second wafer comprises: patterning the support substrate to form first and second support electrode openings that expose the first and second electrodes of the light emitting structures; and filling the first and second support electrode openings with a conductive material to form the first and second support electrodes.

In some embodiments, the method further comprises, prior to forming the first and second support electrodes, providing an insulating layer on inner sidewalls of the first and second support electrode openings.

In some embodiments, the method further comprises, following bonding the second wafer to the first wafer, planarizing a surface of the second wafer to expose lower surfaces of the first and second support electrodes.

In some embodiments, at least partially removing the second support connection portions between neighboring support structures comprises: applying a mask pattern to cover the first and second support electrodes and the first support connection portions; and at least partially removing the second support connection portions between neighboring support structures using the mask pattern as a mask.

In some embodiments, at least partially removing the second support connection portions between neighboring support structures comprises removing substantially all of the second connection portions.

In some embodiments, the method further comprises, following removing substantially all of the second support connection portions, forming openings between neighboring light emitting structures, and then physically separating the neighboring corresponding light emitting devices and support structures.

BRIEF DESCRIPTION OF THE DRAWINGS

The above and other aspects, features and other advantages of embodiments of the present inventive concepts will be more clearly understood from the following detailed description taken in conjunction with the accompanying drawings, in which.

DETAILED DESCRIPTION

Figure 1A:
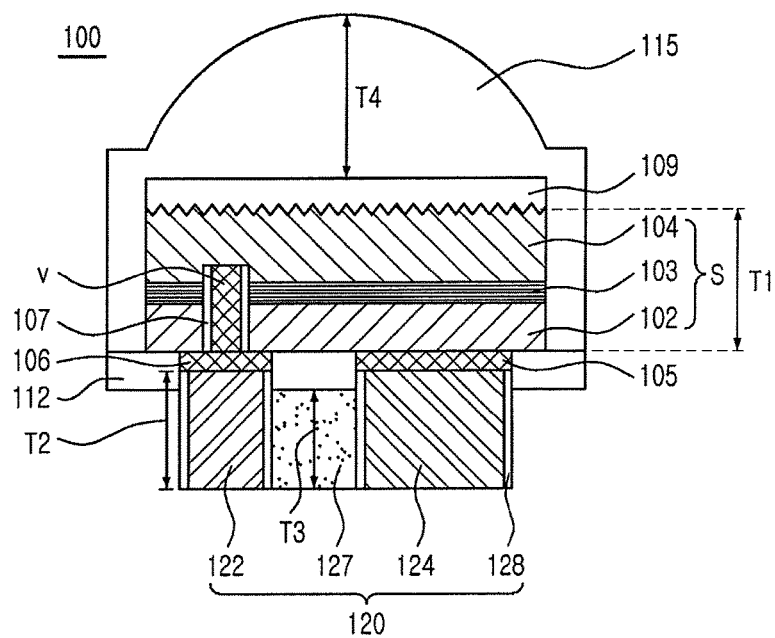
FIG. 1A is a cross-sectional view schematically illustrating a light emitting device package according to an embodiment of the present inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a cross-sectional view schematically illustrating a light emitting device package according to an embodiment of the present inventive concepts.

Figure 1B:
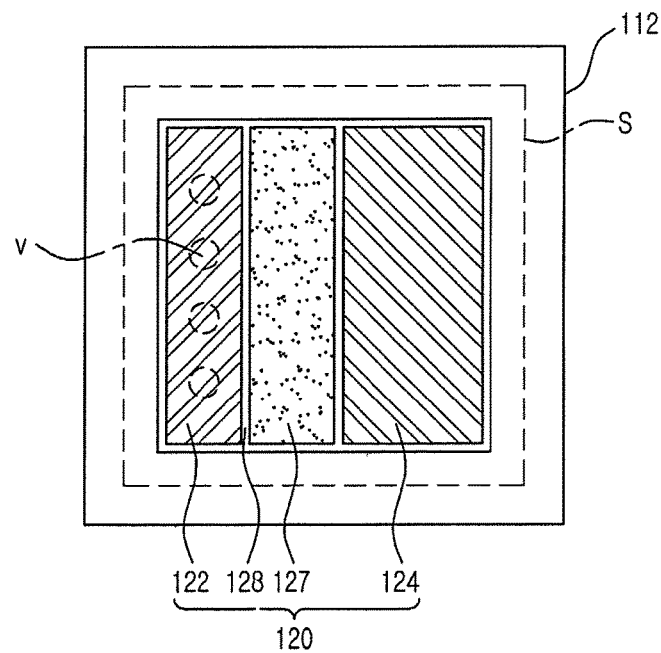
FIGS. 1B and 1C are schematic bottom views of the light emitting device package according to an embodiment of the present inventive concepts, respectively.
Figure 1C:
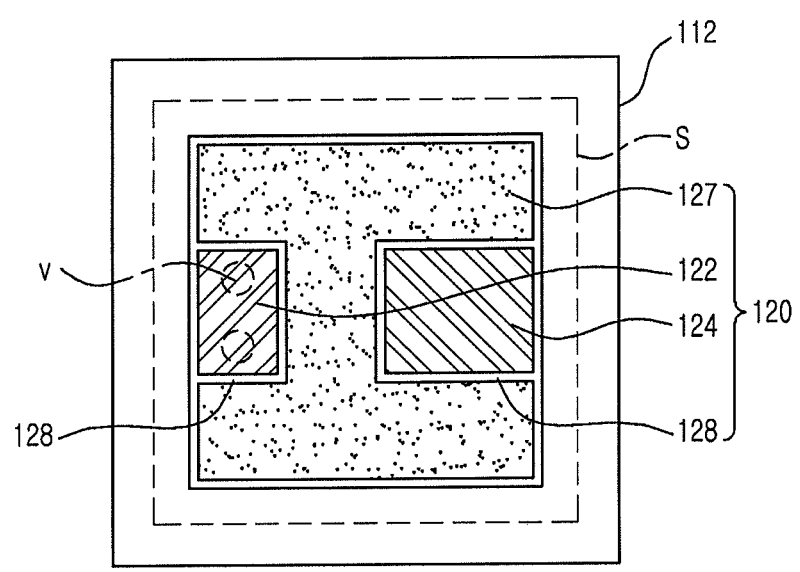

FIGS. 1B and 1C are schematic bottom views of the light emitting device package according to an embodiment of the present inventive concepts, respectively.

Referring to FIG. 1A, a light emitting device package 100 according to an embodiment of the present inventive concepts includes a support structure 120 and a light emitting structure S, and may include first and second electrodes 105 and 106, a bonding layer 112, a wavelength conversion layer 109, and a lens unit 115. The light emitting device package 100 according to the present embodiment may take the form of a chip scale package (CSP) or a wafer level package (WLP).

The support structure 120 may include first and second support electrodes 122 and 124, a connection portion 127, and an insulating layer 128. The light emitting structure S may include a first conductivity-type semiconductor layer 102, an active layer 103, and a second conductivity-type semiconductor layer 104. It is noted that in the present disclosure, terms such as 'upper portion', 'upper surface', 'lower portion', 'lower surface', 'lateral surface', and the like, are determined with reference to their depiction in the drawings, and in actuality, the terms may be changed in accordance with a direction in which the device is disposed.

The first and second conductivity-type semiconductor layers 102 and 104 constituting the light emitting structure S may comprise a p-type semiconductor layer and an n-type semiconductor layer, respectively. However, it is noted that the present inventive concepts are not limited thereto and, conversely, in various other embodiments, the first and second conductivity-type semiconductor layers 102 and 104 may comprise n-type and p-type semiconductor layers, respectively. In some embodiments, the first and second conductivity-type semiconductor layers 102 and 104 may comprise a nitride semiconductor, e.g., a material having a composition of $Al_xIn_yGa_{1-x-y}N$ ($0 \leq x \leq 1$, $0 \leq y \leq 1$, $0 \leq x+y \leq 1$). Each of the semiconductor layers 102 and 104 may be configured as a single layer, or may include a plurality of layers having different characteristics such as different doping concentrations, compositions, and the like.

In other embodiments, the n-type and p-type semiconductor layers 102 and 104 may comprise an AlInGaP or AlInGaAs semiconductor. The active layer 103, disposed between the first and second conductivity-type semiconductor layers 102 and 104, emits light having a certain energy level, determined in accordance with the recombination of electrons and holes. In other embodiments, the active layer 103 may have a multi-quantum well (MQW) structure in which quantum well layers and quantum barrier layers are alternately laminated. For example, in the case of the nitride semiconductor, a GaN/InGaN structure may be employed. A single quantum well (SQW) structure may also be used.

Also, although not shown, the light emitting structure S may further include a growth substrate positioned on the second conductivity-type semiconductor layer 104. The growth substrate may have depressions and protrusions formed on a surface (i.e., an uneven or irregular surface) on which the light emitting structure S is not formed. The growth substrate may be removed by performing a process such as a laser lift-off process. Also, although not shown, a passivation layer may be formed to cover an upper surface and/or a lateral surface of the light emitting structure S. The passivation layer may comprise silicon nitride or silicon oxide.

In some embodiments, the second conductivity-type semiconductor layer 104 may have a concave-convex surface so as to enhance light extraction efficiency. For example, the depressions and protrusions (concave and convex portions) may be obtained by wet-etching the second conductivity-type semiconductor layer 104 or by dry-etching the same by using plasma after removing the growth substrate from the light emitting structure.

In some embodiments, the first and second electrodes 105 and 106 may be positioned on a lower surface of the light emitting structure S. A plurality of first and second electrodes 105 and 106 may be formed. In this case, the plurality of first electrodes 105 may be connected to each other on the lower surface of the light emitting structure S. Also, the plurality of second electrodes 106 may also be connected to each other on the lower surface of the light emitting structure S. The first and second electrodes 105 and 106 may be made of a conductive material known in the art. For example, the first and second electrodes 105 and 106 may include one or more of silver (Ag), aluminum (Al), nickel (Ni), chromium (Cr), copper (Cu), palladium (Pd), platinum (Pt), tin (Sn), tungsten (W), rhodium (Rh), iridium (Ir), ruthenium (Ru), magnesium (Mg), zinc (Zn), titanium (Ti), or an alloy material including one or more of these elements. In some embodiments, the second electrode 106 may include one or more vias (v), electrically connected to the second conductivity-type semiconductor layer 104 through the first conductivity-type semiconductor layer 102 and the active layer 103. An electrode insulating layer 107 may be formed to surround the via v in order to electrically insulate the second electrode 106 from the first conductivity-type semiconductor layer 102 and the active layer 103. A plurality of vias may be formed and an arrangement pattern of the vias v is not limited to the configurations or shapes illustrated in FIGS. 1B and 1C. For example, vias may be arranged in a plurality of rows and columns.

The support structure 120 includes the first and second support electrodes 122 and 124 as conductive regions, and may further include the connection portion 127 positioned between the first support electrode 122 and the second support electrode 124, and the insulating layer 128 positioned on the lateral surfaces of the first and second support electrodes 122 and 124 to insulate the first and second supports 122 and 124 from the connection portion 127.

The first support electrode 122 may be in direct contact with the second electrode 106 so as to be electrically connected thereto, and the second support electrode 124 may be in direct contact with the first electrode 105 so as to be electrically connected thereto. The first and second support electrodes 122 and 124 may extend over the entire thickness from an upper surface of the support structure 120 to a lower surface thereof. Thus, in some embodiments, outer sidewall surfaces of the first and second support electrodes 122 and 124 may be exposed from a lower surface of the support structure 120.

In some embodiments, the first and second support electrodes 122 and 124 may be constructed and arranged to support the light emitting structure S and may transmit an electrical signal from the light emitting structure S to an external device as well as being used as a path for transmitting heat. In addition, the first and second support electrodes 122 and 124 may operate as a reflective layer reflecting light from the active layer 103 toward the lens unit 115. In various embodiments, the first and second support electrodes 122 and 124 may comprise at least one of copper (Cu), aluminum (Al), silver (Ag), gold (Au), nickel (Ni), chromium (Cr), palladium (Pd), copper (Cu), platinum (Pt), tin (Sn), tungsten (W), rhodium (Rh), iridium (Ir), ruthenium (Ru), magnesium (Mg), zinc (Zn), or alloys thereof. The first and second support electrodes 122 and 124 may comprise a material having excellent electrical conductivity, excellent heat conductivity, and, in some embodiments, facilitating an electrolytic plating process.

In some embodiments, the light emitting structure S may have a first thickness T1, and the first and second electrodes 122 and 124 may have a second thickness T2 that is greater than the first thickness T1. For example, the second thickness T2 may have a range from 10 μm to 500 μm. In the event the support structure 120 including the first and second support electrodes 122 and 124 is relatively thin, handling of the support structure 120 during manufacturing processes may be rendered difficult. At the same time, if the support structure 120 is relatively thick, manufacturing costs may be increased. The connection portion 127 may have a third thickness T3 that is less than the second thickness T2.

The connection portion 127 may operate to support the first and second support electrodes 122 and 124 to thereby enhance mechanical properties of the support structure 120. When the connection portion 127 is made of a semiconductor material such as silicon (Si), or the like, a ceramic material such as AlN and $Al_2O_3$, or the like, or a metal material, the connection portion 127 may also serve to provide a heat conduit, or heat dissipation function, for the resulting device.

The insulating layer 128 can be included to insulate the first and second support electrodes 122 and 124 from the connection portion 127 and to protect the first and second support electrodes 122 and 124. However, such insulating layer 128 is not essential and may be optionally included in the support structure 120 according to a material of the connection portion 127. In particular, external portions of the insulating layer 128 on the outer, lateral surfaces of the first and second support electrodes 122 and 124, and not in contact with the connection portion 127 may, in some embodiments, be omitted. The thickness of the insulating layer 128 may vary, and, in some embodiments, the insulating layer 128 may be formed to be separated from the edges of the first and second electrodes 105 and 106 by a predetermined distance.

Referring to FIGS. 1B and 1C, in some embodiments, the support structure 120 may have a rectangular shape. In some embodiments, the width of the support structure 120 may be less than that of the light emitting structure S. In the present disclosure, the term 'width' is used to mean measurement of distance in a direction perpendicular to a direction in which the support structure 120 and the light emitting structure S are laminated, unless otherwise specified. In some embodiments, the width of the support structure 120 may range from 65% to 95% of the width of the light emitting structure S.

In some cases, if the width of the support structure 120 is arranged to be less than 65% of the width of the light emitting structure S, stability of the structure, such as maintained balance, or the like, may not be available in mounting the light emitting device package 100 on a circuit board, or the like, and heat dissipation characteristics may be degraded.

Also, in some cases, if the width of the support structure 120 exceeds 95%, this can be problematic for separating the devices during wafer-level manufacture. For example, when the devices are separated into package units, the support structure 120 including the first and second support electrodes 122 and 124 should be cut and, in this case, an interface in contact with the support substrate 120 may be damaged.

In view of the above, in some embodiments, the width of portions of the light emitting structure S that protrude in a lateral direction from the first and second electrodes 122 and 124 may be 5% to 35% of the overall width of the light emitting structure S.

In some embodiments, the first and second support electrodes 122 and 124 may also have a rectangular shape and, in various embodiments, may be disposed on different sides, on opposite sides, and on the same side, of the support structure 120. The second support electrode 122 may be greater in cross-sectional area than the first support electrode 122, or the first and second support electrodes 122 and 124 may have the same cross-sectional area. The first and second support electrodes 122 and 124 are not limited to the sizes thereof illustrated in the drawing. Also, the sum of the widths of the first and second support electrodes 122 and 124 may be greater than a width of the connection portion 127, thereby enhancing heat dissipation characteristics.

Additional elements of the device package will now be described with reference to FIG. 1A. The bonding layer 112 is positioned between the support substrate 120 and the light emitting structure S. In some embodiments, the bonding layer 112 serves to bond (or attach) the support structure 120 and the light emitting structure S. The bonding layer 112 covers the first and second electrodes 105 and 106, and the first and second support electrodes 122 and 124 may extend to the interior of the bonding layer 124. Thus, the first electrode 105 may be connected to the second support electrode 124 within the bonding layer 112, and the second electrode 106 may be connected to the first support electrode 122 within the bonding layer 112. The bonding layer 112 may comprise a material having electrical insulating properties, e.g., a silicon oxide or silicon nitride such as $SiO_2$, $SiO_xN_y$, $Si_xN_y$, or the like. Alternatively, the bonding layer 112 may comprise one or more of a ceramic, a resin such as polymer, a semiconductor or metal having electrical conductivity, or the like. In some embodiments, the bonding layer 112 may comprise a eutectic bonding layer including AuSn, NiSi, or the like, according to an embodiment.

The wavelength conversion layer 109 may include phosphors selected to be excited by light emitted from the light emitting structure S to emit light beams having different wavelengths. Light emitted from the phosphors and light emitted from the light emitting structure S may be combined to output desired light such as white light, or the like. According to an embodiment, the wavelength conversion layer 109 may be formed to be spaced apart from the light emitting structure S by a predetermined distance within the lens unit 115, or may be formed on the lens unit 115 through, for example, a spray coating.

The lens unit 115 may cover the light emitting structure S to encapsulate it, and as illustrated, the lens unit 115 may have a structure having a dome-like shape with a convex upper surface; however, the present inventive concepts is not limited thereto. For example, in order to enhance light diffusion in a lighting device or a backlight unit, the lens unit 115 may include colloid particles positioned on a surface thereof, and may have a flat upper surface. Alternately, the lens unit 115 may have an aspherical surface and/or an asymmetrical shape or may have depressions and protrusions on an upper surface thereof. Also, in order to enhance linear properties of light (or linear propagation of light) from a camera flash, or the like, the lens unit 115 may include a light condensing unit (or a light concentrating unit) having a Fresnel shape and an upper surface thereof may have depressions and protrusions.

The lens unit 115 may be made of a material having excellent light transmission and heat resistance such as, for example, silicon, epoxy, glass, plastic, or the like. The lens unit 115, having a convex or concave lens structure, may be able to regulate an angle of beam spread of light emitted through an upper surface thereof. The lens unit 115 may have a fourth height (T4), which is the greatest at a central portion thereof, and the fourth height T4 may be greater than a first height T1, i.e., a height of the light emitting structure S.

The lens unit 115 may be supported by the bonding layer 112, and may be formed upon being cured as having a certain shape above the light emitting structure S and the wavelength conversion layer 109. The lens unit 115 may be selectively formed of a resin having a high level of transparency allowing light generated by the light emitting structure S to pass therethrough with a minimal level of loss. For example, an elastic resin, silicon, an epoxy resin, or plastic may be used as a material of the lens unit 115.

Referring to FIG. 1A, it can be seen in this figure that the light emitting structure S protrudes in a horizontal direction beyond a sidewall of at least one of the first and second support electrodes 122, 124. In this manner, a void is present below the protrusion portion and above a plane extending from bottoms of the first and second support electrodes 122, 124. This concept applies equally well to the other embodiments described herein in FIGS. 2-15.

From another perspective, it can be seen in the embodiment of FIG. 1A that the support structure 120 itself protrudes in a vertical direction relative to the light emitting structure S. In this manner, a void is present below the light emitting structure S and above a plane extending from bottoms of the first and second support electrodes 122, 124. This concept applies equally well to the other embodiments described herein in FIGS. 2-15.

From another perspective, it can be seen in the embodiment of FIG. 1A that the light emitting structure S can be said to have a first width in the horizontal direction and the support structure 120 can be said to have a second width on the horizontal direction, wherein the first width is greater than the second width. This concept applies equally well to the other embodiments described herein in FIGS. 2-15.

From another perspective, it can be seen in the embodiment of FIG. 1A, and especially in FIGS. 1B and 1C, that the first and second support electrodes 122, 124 can be said to have a combined first width in a first horizontal direction at a widest portion of the support electrodes 122, 124. At the same time, the support connection portion has a second width in the first horizontal direction. In some embodiments, the combined first width is greater than the second width in that horizontal direction. This concept applies equally well to the other embodiments described herein in FIGS. 2-15.

From another perspective, it can be seen in the embodiment of FIG. 1A, that the first and second support electrodes 122, 124 can be said to be unitary between sidewalls thereof. This concept applies equally well to the other embodiments described herein in FIGS. 2-15.

Figure 2:
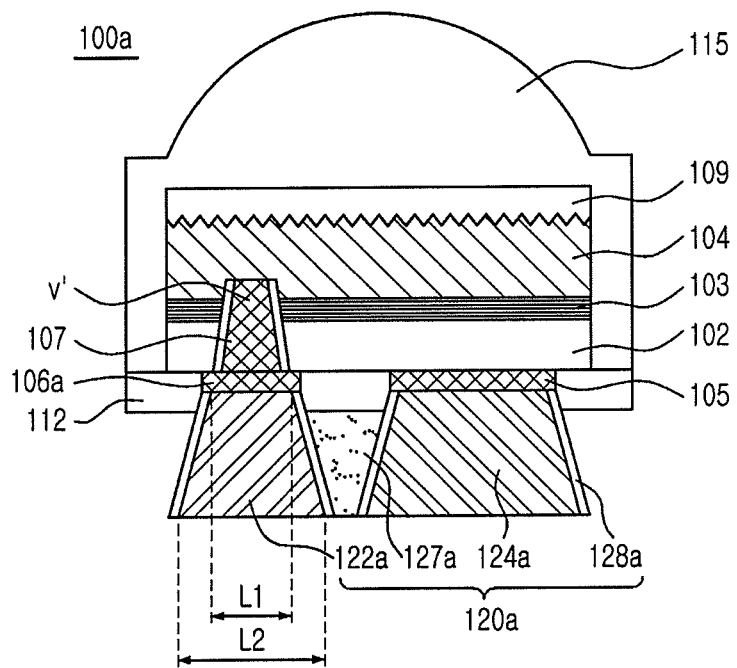
FIG. 2 is a cross-sectional view schematically illustrating a light emitting device package according to an embodiment of the present inventive concepts.

FIG. 2 is a cross-sectional view schematically illustrating a light emitting device package according to an embodiment of the present inventive concepts.

Referring to FIG. 2, a light emitting device package 100a according to an embodiment of the present inventive concepts includes a support structure 120a and a lighting emitting structure S, and may include first and second electrodes 105 and 106a, the bonding layer 112, the wavelength conversion layer 109, and the lens unit 115. The support structure 120a may include first and second support electrodes 122a and 124a, a connection portion 127a, and an insulating layer 128a.

Unlike the light emitting device package 100 illustrated in FIG. 1A, the first and second support electrodes 122a and 124a may have a downwardly tapered shape. In detail, as illustrated in FIG. 2, a length L1 of an upper surface of the first support electrode 122a may be smaller than a length L2 of a lower surface thereof, and accordingly, the first support electrode 122a may have a lateral surface sloped at a predetermined angle. Similarly, the second support electrode 124a may also have a tapered shape. Thus, the support structure 120a has a shape in which a width of a lower surface thereof is greater than that of an upper surface thereof. This configuration can enhance structural stability when mounted on an external device such as a module board, or the like, and also enhancing heat dissipation characteristics.

In the present embodiment, the second electrode 106a may also include a via v' having a tapered shape. In this embodiment, the via v' has a shape in which a width of a lower surface thereof is greater than that of an upper surface thereof. In other embodiments, the via v' may have a step-like shape or may have a lateral surface sloped at a predetermined angle.

Figure 3:
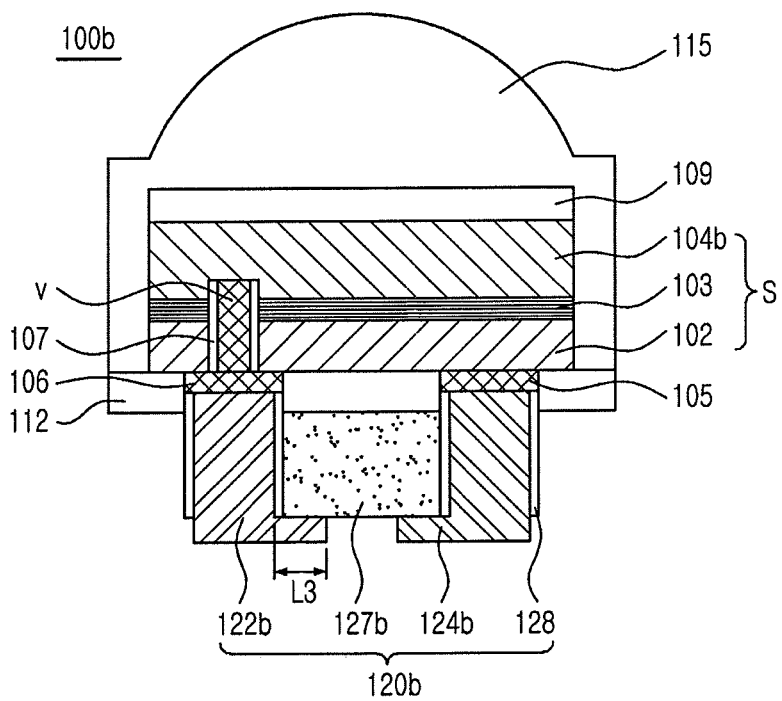
FIG. 3 is a cross-sectional view schematically illustrating a light emitting device package according to an embodiment of the present inventive concepts.

FIG. 3 is a cross-sectional view schematically illustrating a light emitting device package according to an embodiment of the present inventive concepts.

Referring to FIG. 3, a light emitting device package 100b according to an embodiment of the present inventive concepts includes a support structure 120b and a lighting emitting structure S, and may include the first and second electrodes 105 and 106, the bonding layer 112, the wavelength conversion layer 109, and the lens unit 115. The support structure 120b may include first and second support electrodes 122b and 124b, a connection portion 127b, and the insulating layer 128.

Unlike the light emitting device package 100 illustrated in FIG. 1A, the first and second support electrodes 122b and 124b may include an extension portion that extends under the connection portion 127b by a predetermined distance L3 so that the connection portion 127b is on the extension portion. Thus, in a case in which the first and second support electrodes 122b and 124b are formed to have a narrow upper surface, for example, in case of having a hole shape, according to an application device, the first and second support electrodes 122b and 124b may have a relatively large area and extend onto the lower surface of the connection portion 127b, securing heat dissipation characteristics. The shape of the extended first and second support electrodes 122b and 124b are not limited to the illustrated shape and may be appropriately modified according to a product in which the light emitting device package 100 is mounted.

In the present embodiment, the second conductivity-type semiconductor layer 104b may have a structure without depressions and protrusions.

Figure 4:
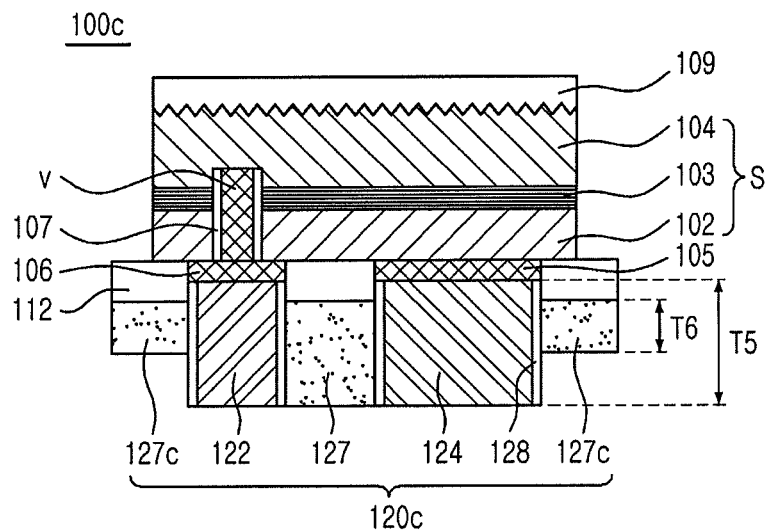
FIG. 4 is a cross-sectional view schematically illustrating a light emitting device package according to an embodiment of the present inventive concepts.

FIG. 4 is a cross-sectional view schematically illustrating a light emitting device package according to an embodiment of the present inventive concepts.

Referring to FIG. 4, a light emitting device package 100c according to an embodiment of the present inventive concepts includes a support structure 120c and a lighting emitting structure S, and may include the first and second electrodes 105 and 106, the bonding layer 112, and the wavelength conversion layer 109. The support structure 120c may include the first and second support electrodes 122 and 124, connection portions 127 and 127c, and an insulating layer 128. In the present embodiment, the light emitting device package 100c a lens unit 115 (please see FIG. 1A) is not included. However, such a lens unit 115 is optional and may be included.

Unlike the light emitting device package 100 illustrated in FIG. 1A, the connection portions 127 and 127c may further include the connection portions 127c positioned on both sides of the first and second support electrodes 122 and 124. In this case, the connection portions 127c may have a sixth thickness T6 that is less than a fifth thickness T5 of the first and second support electrodes 122 and 124. Thus, the first and second support electrodes 122 and 124 may have a structure in which they are protruded in a downward orientation, relative to the connection portions 127c. In the case of the light emitting device package 100c according to the present embodiment, regions of the connection portions 127 and 127c are increased to further enhance mechanical characteristics of the support structure 120c.

Figure 5:
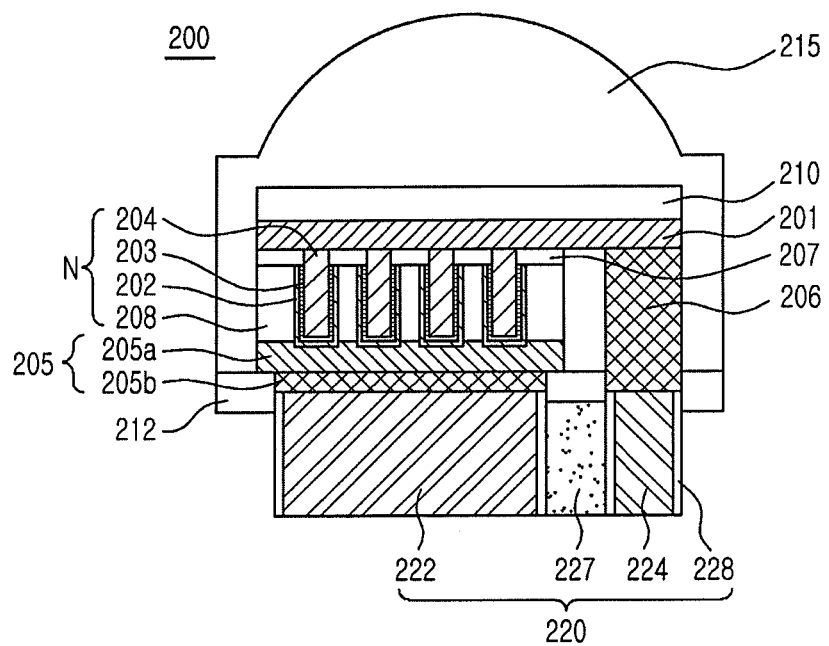
FIG. 5 is a cross-sectional view schematically illustrating a light emitting device package according to an embodiment of the present inventive concepts.

FIG. 5 is a cross-sectional view schematically illustrating a light emitting device package according to an embodiment of the present inventive concepts.

Referring to FIG. 5, a light emitting device package 200 according to an embodiment of the present inventive concepts may include a substrate 210, a support structure 220, and a light emitting nano-structure N, and may include a bonding layer 212, a wavelength conversion layer 201, and a lens unit 215. The light emitting device package 200 has a structure including a nano-LED chip.

The support structure 220 may include first and second support electrodes 222 and 224, a connection portion 227, and an insulating layer 228.

The substrate 210 may be provided as a growth substrate for the light emitting nano-structure N, and may be made of a material such as sapphire, SiC, Si, $MgAl_2O_4$, MgO, $LiAlO_2$, $LiGaO_2$, GaN, or the like, or may be made of an insulating material, a conductive material, or a single crystal or polycrystalline material. Sapphire commonly used as a nitride semiconductor growth substrate is a crystal having Hexa-Rhombo R3c symmetry, of which lattice constants in c-axis and a-axis directions are 13.001 Å and 4.758 Å, respectively. A sapphire crystal has a C (0001) face, an A (1120) face, an R (1102) face, and the like. In this case, a nitride thin film can be relatively easily formed on the C face of the sapphire crystal, and because sapphire crystal is stable at high temperatures, it is commonly used as a material for a nitride growth substrate. A silicon (Si) substrate may also be appropriately used as the substrate 210, and mass-production can be enhanced by using a silicon (Si) substrate which may have a large diameter and may be relatively low in price. In the case in which a silicon (Si) substrate is used, a nucleation layer comprising a material such as $Al_xGa_{1-x}N$ may be formed on the substrate 210 and a nitride semiconductor having a desired structure may be grown on the nucleation layer.

The light emitting nano-structure N includes a first conductivity-type semiconductor layer 202, an active layer 203, and a second conductivity-type semiconductor core 204. As illustrated in FIG. 5, the light emitting device package 200 may include a plurality of nano-structures N formed on the substrate 210, and the light emitting nano-structures N. It is illustrated that the light emitting nano-structure N has a core-shell structure as a rod structure; however, the present inventive concepts are not limited thereto and the light emitting nano-structure N may have a different structure such as a pyramid structure. For example, according to an embodiment, the light emitting nano-structure N may include a nano-wire, a quantum dot, or a nano-box structure. In other embodiments, the light emitting nano-structure N may have a structure having a sloped surface with respect to the surface of the substrate 210, and a shape of a cross-section parallel to the substrate 210 may have various shapes such as polygonal shapes such as a triangular shape, a quadrangular shape, a pentagonal shape, a hexagonal shape, and an octagonal shape, or a circular shape.

The light emitting device package 200 may further include a second conductivity-type semiconductor base layer 201, an electrode insulating layer 207, and a filler 208 filling spaces between the light emitting nano-structures N. The second conductivity-type semiconductor base layer 201 may provide a growth surface for the light emitting nano-structure N. The electrode insulating layer 207 may provide an open region for the growth of the light emitting nano-structure N and may be made of a dielectric material such as $SiO_2$ or $SiN_x$. A size of the open region may range from 5 nm to 10 um. The filler 208 may structurally stabilize the light emitting nano-structures N and may serve to allow light to be transmitted therethrough or may reflect light. In a case in which the filler 208 includes a light-transmissive material, the filler 208 may be made of a transparent material such as $SiO_2$, SiNx, an elastic resin, silicon, an epoxy resin, a polymer, or plastic. In a case in which the filler 208 includes a reflective material, the filler 208 may be made of a polymer material such as polypthalamide (PPA), or the like, including $TiO_2$, $Al_2O_3$, or the like, having a high level of light reflectivity, and may be made of a material having a high level of heat resistance and light fastness qualities.

In some embodiments, the light emitting device package 200 further includes an ohmic-contact layer 205a formed under the light emitting nano-structures N and the filler 208 and a second electrode 206 positioned on an exposed upper surface of the second conductivity-type semiconductor base layer 201. The ohmic-contact layer 205a forms a first electrode 205 together with an electrode extending portion 205b, and here, the ohmic-contact layer 205a and the electrode extending portion 205b may be integrally formed. The ohmic-contact layer 205a may comprise a reflective or light-transmissive material. The reflective material may include silver (Ag), aluminum (Al), or alloys thereof, and the ohmic-contact layer 205a may have a multilayer structure including these elements. Alternatively, a reflective structure using a distributed Bragg reflector (DBR) may also be used. Although not shown, depressions and protrusions and/or a phosphor layer may be further formed on the surface of the substrate 210 in the light emitting device package 200, and according to an embodiment, the substrate 210 may be removed and depressions and protrusions or a phosphor layer may be formed on the surface of the second conductivity-type semiconductor base layer 201.

Figure 6:
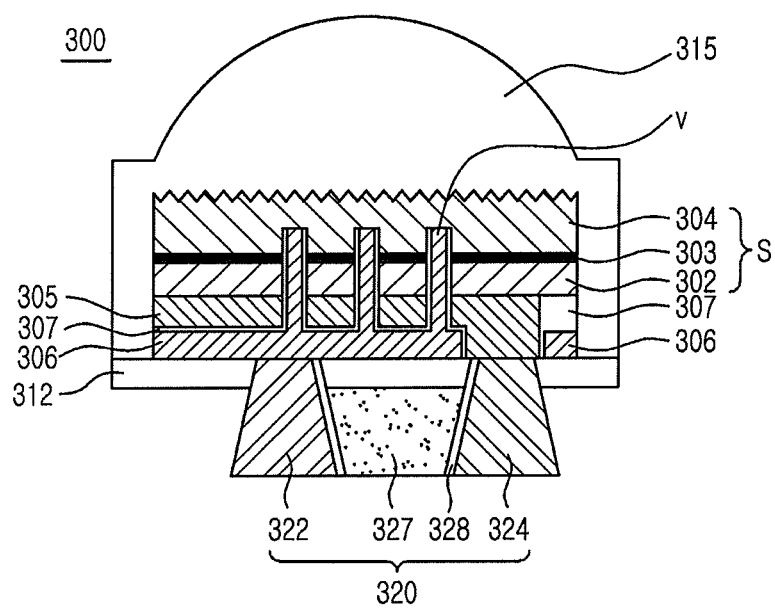
FIG. 6 is a cross-sectional view schematically illustrating a light emitting device package according to an embodiment of the present inventive concepts.

FIG. 6 is a cross-sectional view schematically illustrating a light emitting device package according to an embodiment of the present inventive concepts.

Referring to FIG. 6, a light emitting device package 300 includes a support structure 320 and a light emitting structure S, and may include a bonding layer 312 and a lens unit 315.

The support structure 320 may include first and second support electrodes 322 and 324, a connection portion 327, and an insulating layer 328. In particular, in the present embodiment, the insulating layer 328 is illustrated as being formed on only lateral surfaces on which the first and second support electrodes 322 and 324 are in contact with the connection portion 327. Outer sidewall surfaces of the support electrodes are exposed and are not covered by the insulating layer. Also, in the present embodiment, the first and second support electrodes 322 and 324 may have a tapered shape; however, other configurations for the support electrodes are possible and applicable to the inventive concepts.

The light emitting structure S includes a first conductivity-type semiconductor layer 302, an active layer 303, and a second conductivity-type semiconductor layer 304.

The second electrode 306 is formed between the first electrode 305 and the bonding layer 312, and is electrically connected to the second conductivity-type semiconductor layer 304 through a via v. The via v is electrically connected to the second conductivity-type semiconductor layer 304 through the first conductivity-type semiconductor layer 302 and the active layer 303. An electrode insulating layer 307 may be positioned to surround the via v in order to electrically insulate the second electrode 306 from the first conductivity-type semiconductor layer 302 and the active layer 303. The electrode insulating layer 307 may also be interposed between the first electrode 305 and the second electrode 306. In this case, a silicon oxide or a silicon nitride having a thickness ranging from approximately 0.7 μm to 1.2 μm may be used. In the present embodiment, the first electrode 305 may be formed to pass through through-holes formed in the second electrode 306 or may be formed to pass through lateral surfaces of the second electrode 306.

FIGS. 7A through 7K are cross-sectional views illustrating sequential processes of manufacturing a light emitting device package according to an embodiment of the present inventive concepts.

FIGS. 7A through 7K will be described on the basis of the light emitting device package of FIG. 1A, but the light emitting device package of FIGS. 2 through 6 may also be manufactured in a similar manner.

Figure 7A:
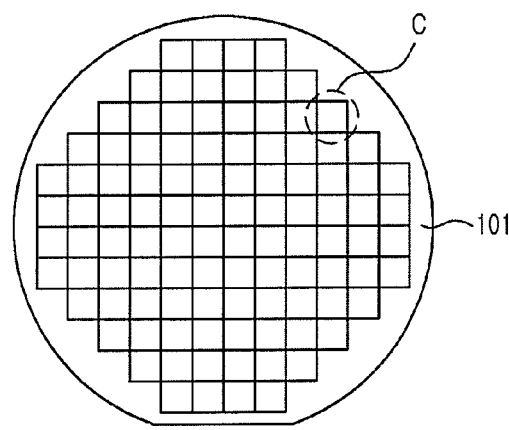
FIGS. 7A through 7K are cross-sectional views illustrating sequential processes of manufacturing a light emitting device package according to an embodiment of the present inventive concepts.
Figure 7B:
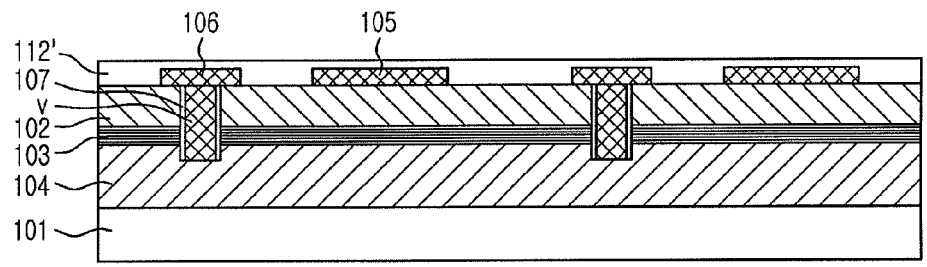

Referring to FIGS. 7A and 7B, a process of forming a light emitting laminate constituting the light emitting structure S (FIG. 1A) is performed. The second conductivity-type semiconductor layer 104, the active layer 103, and the first conductivity-type semiconductor layer 102 are sequentially grown on the substrate 101 on a wafer level.

In FIG. 7A, the substrate 101 is illustrated as having a wafer level, and a plurality of light emitting devices may be simultaneously manufactured. On the substrate 101, light emitting device regions C constituting a plurality of light emitting devices may be formed. Namely, a single light emitting device region C is a region in which a single light emitting structure S (FIG. 1A) is formed or a region of a single LED chip. For example, a single light emitting device region C may have a square shape, a rectangular shape, a triangular shape, or any other polygonal shape having a length ranging from 300 μm to 10000 μm.

In FIG. 7B and the following drawings, a manufacturing method will be described in a manner of illustrating portions of two light emitting device packages; however, the following processes may be performed at a larger scale, at the wafer level as illustrated in FIG. 7A.

The substrate 101 is provided as a semiconductor growth substrate, and, for example, a silicon (Si) substrate may be used. The second conductivity-type semiconductor layer 104, the active layer 103, and the first conductivity-type semiconductor layer 102 may be sequentially grown on the substrate 101 by using a process known in the art such as metal organic chemical vapor deposition (MOCVD), hydride vapor phase epitaxy (HVPE), molecular beam epitaxy (MBE), or the like. A total thickness of the second conductivity-type semiconductor layer 104, the active layer 103, and the first conductivity-type semiconductor layer 102 may range, for example, from 2.5 μm to 10 μm.

For example, the first conductivity-type semiconductor layer 102 may include an electron blocking layer having a high aluminum (Al) content, relative to indium (In) in order to prevent the passage of electrons from the active layer 103 and a p layer forming a p electrode and having a doping level of magnesium (Mg) equal to or more than $1 \times 10E19$ cm$^{-3}$ in order to inject holes. The second conductivity-type semiconductor layer 104 may include a high resistance layer including a doping level of silicon (Si) equal to or less than $1 \times 10E18$ cm$^{-3}$ in order to enhance crystallinity and reduce leakage current, a crystallinity enhancement layer including aluminum (Al), an electrode formation layer forming an n electrode and having a doping level of silicon (Si) equal to or more than $1 \times 10E19$ cm$^{-3}$ in order to increase electron injection efficiency, and a current spreading layer having a high indium (In) content, relative to aluminum (Al), in order to increase crystallinity of the active layer 103 and obtain a current spreading effect.

Next, in order to form a via v, a via hole may be formed through an etching process using a mask and the electrode insulating layer 107 may be deposited. A plurality of vias v may be formed in a single light emitting device region C. The amount of vias v and contact areas thereof may be adjusted such that the area of the plurality of vias v occupying on the plane of the regions in which they are in contact with the second conductivity-type semiconductor layer 104 ranges from 1% to 5% of the area of the light emitting structure S (FIG. 1A). A radius of the via v may range, for example, from 5 μm to 20 μm, and the number of vias v may be 1 to 50 per light emitting device region (C) according to a width of the light emitting region (C). Although different according to a width of the light emitting device region (C), three or more vias may be provided. A distance between the vias v may range from 100 μm to 500 μm, and the vias v may have a matrix structure including rows and columns. In particular, the distance between vias may range from 150 μm to 450 μm. If the distance between the vias is smaller than 100 μm, the amount of vias v is increased to relatively reduce a light emitting area to lower luminous efficiency, and if the distance between the vias is greater than 500 μm, it may be difficult to spread current to degrade luminous efficiency. A depth of the via v may range from 0.5 μm to 5.0 μm although it may be different according to a thickness of the first conductivity-type semiconductor layer 102 and the active layer 103.

The first and second electrodes 105 and 106 are formed by depositing a conductive ohmic-material on the light emitting laminate. The first and second electrodes 105 and 106 may include at least one of Ag, Al, Ni, Cr, Cu, Au, Pd, Pt, Sn, Ti, W, Rh, Ir, Ru, Mg, Zn, and alloys thereof. For example, the first electrode 105 may be formed as a silver (Ag) ohmic-electrode layer with respect to the first conductivity-type semiconductor layer 102. The silver (Ag) ohmic-electrode layer may also serve as a light reflective layer. A single layer made of nickel (NI), titanium (Ti), platinum (Pt), tungsten (W), or a layer of alloys thereof may alternatively laminated selectively on the silver (Ag) ohmic-electrode. In detail, an Ni/Ti layer, a TiW/Pt layer, or a Ti/W layer may be laminated below the silver (Ag) ohmic-electrode layer or these layers may be alternately laminated under the silver (Ag) ohmic-electrode layer. The second electrode 106 may be formed to include a chromium (Cr) layer and Au/Pt/Ti layers sequentially laminated thereon, or may include an Al layer and Ti/Ni/Au layers sequentially laminated thereon. The first and second electrodes 105 and 106 may alternatively employ various additional materials, lamination structures or combinations thereof in order to enhance ohmic characteristics or reflective characteristics.

Thereafter, a bonding layer 112' is formed on the light emitting laminate. The bonding layer 112' may serve to protect the light emitting laminate and assist bonding of the light emitting laminate to a connection substrate 127S in a follow-up process. In the present embodiment, the bonding layer 112' may be made of a silicon oxide such as $SiO_2$ or SiN, and may be deposited through a process such as chemical vapor deposition (CVD), or the like. After the deposition, the bonding layer 112' may be polished to have surface roughness equal to or less than 10 nm by using a process such as chemical mechanical polishing (CMP), or the like. If the surface roughness is more than 10 nm, air may be introduced to the bonding surface to degrade adhesive strength.

Figure 7C:
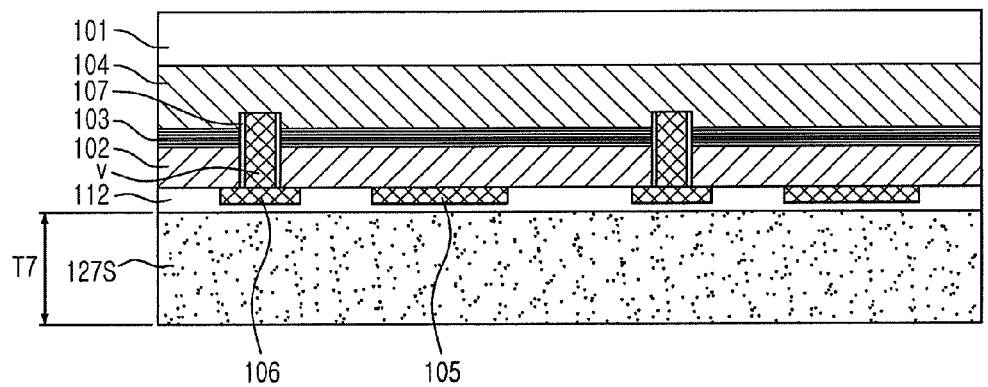

Referring to FIG. 7C, a process of bonding the substrate 101 with the light emitting laminate formed thereon to the connection substrate 127S is performed. The connection substrate 127S may be a substrate for forming the connection portion 127 (please see FIG. 1A) and may have a seventh thickness T7.

Although not shown, a separate substrate bonding layer may also be formed on the connection substrate 127S. In this case, the substrate bonding layer on the connection substrate 127S may be made of the same material as that of the bonding layer 112' in FIG. 7B and may form a portion of a bonding layer 112 of FIG. 7C. For example, both of the substrate bonding layer and the bonding layer 112' may be made of a silicon oxide, and in this case, they may be formed through oxide-oxide bonding or oxide-silicon (Si) bonding, so a bonding process may be readily performed at a lot temperature equal to or lower than 500° C. Also, an overall thickness of the substrate bonding layer and the bonding layer 112' may range from 0.5 μm to 10 μm, and in a case in which both of the substrate 101 and the connection substrate 127S are made of silicon (Si), surface stress may be reduced during a bonding process.

Figure 7D:
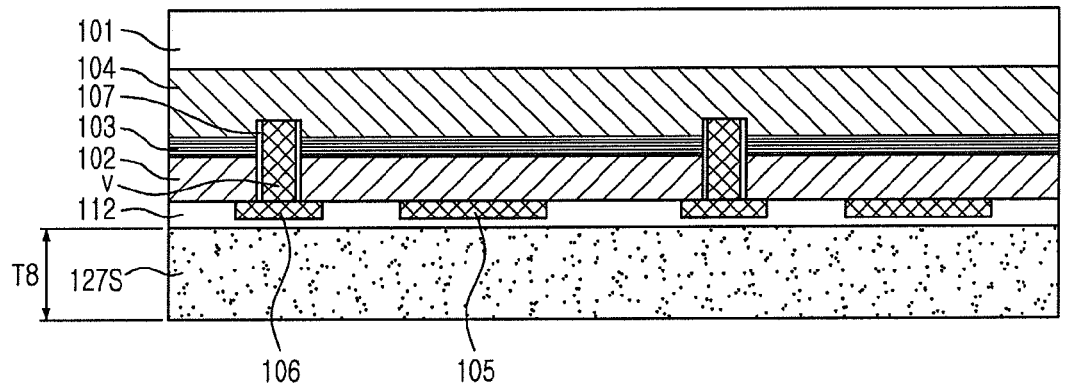

Referring to FIG. 7D, a process of thinning the connection substrate 127S may be performed by using mechanical polishing or CMP process. Through this process, the connection substrate 127S may have an eighth thickness T8 that is less than the seventh thickness T7. The eighth thickness T8 may be controlled according to a product to which the finally formed support structure 120 (please see FIG. 1A) is to be applied.

Figure 7E:
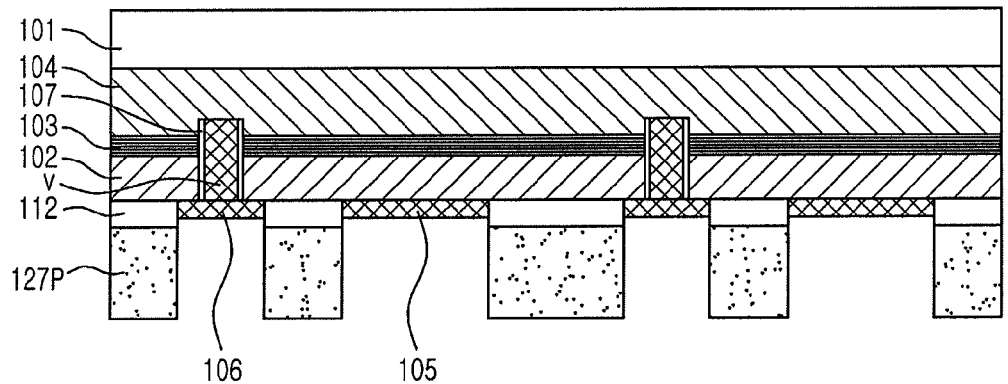

Referring to FIG. 7E, a process of removing portions of the bonding layer 112 and the connection substrate 127S may be performed such that lower surfaces of the first and second electrodes 105 and 106 are exposed. This process may be performed by exposing predetermined regions including regions corresponding to the first and second electrodes 105 and 106 by using a mask layer (not shown), and sequentially removing the connection substrate 127S and the bonding layer 112 of the exposed regions through, for example, a wet etching method using an etching solution, or a dry etching method such as reactive ion etching (RIE), or the like. The removal regions may have, for example, a trench-like shape. According to an embodiment, the removal regions may have trench shapes connected in one direction between adjacent light emitting device regions C on a wafer level as illustrated in FIG. 7A. Alternatively, the removal regions may be limited to the interior of the respective light emitting device regions (C) (please see FIG. 7A) to correspond to regions in which the first and second support electrodes 122 and 124 illustrated in FIG. 1B. are formed.

Through this process, a connection region 127P is formed, and in this case, lower surfaces of the first and second electrodes 105 and 106 may all be exposed as illustrated, but according to an embodiment, only portions including central regions may be exposed. In a case in which the connection substrate 127S is thick, a slope may be formed during an etching process to form the connection region 127P having a tapered shape as illustrated in FIG. 2.

Figure 7F:
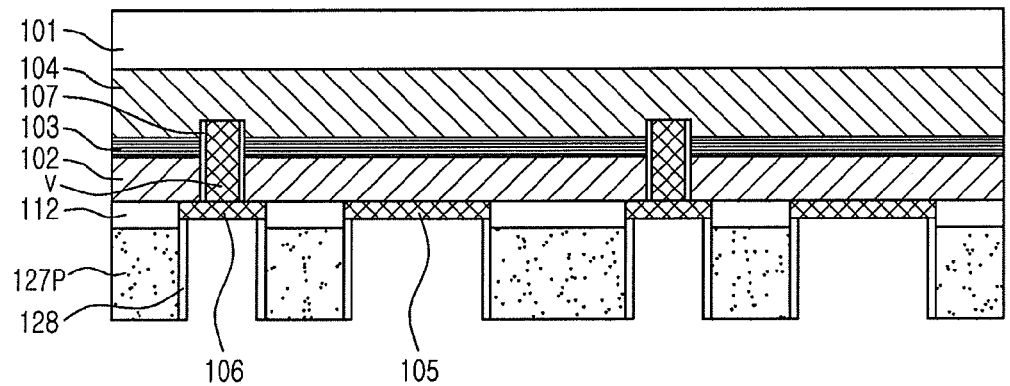

Referring to FIG. 7F, a process of forming an insulating layer 128 may be performed. In a case in which the connection region 127P includes a conductive material, the insulating layer 128 is formed for insulation with respect to the first and second support electrodes 122 and 124 (please see FIG. 1A) to be formed layer. The insulating layer 128 may be formed by depositing, for example, $SiO_2$ and/or SiN as having a thickness ranging from 0.5 μm too 3 μm at a temperature equal to or lower than 500° C. through a CVD process, and exposing the first and second electrodes 105 and 106 through, for example, an etch-back process.

Figure 7G:
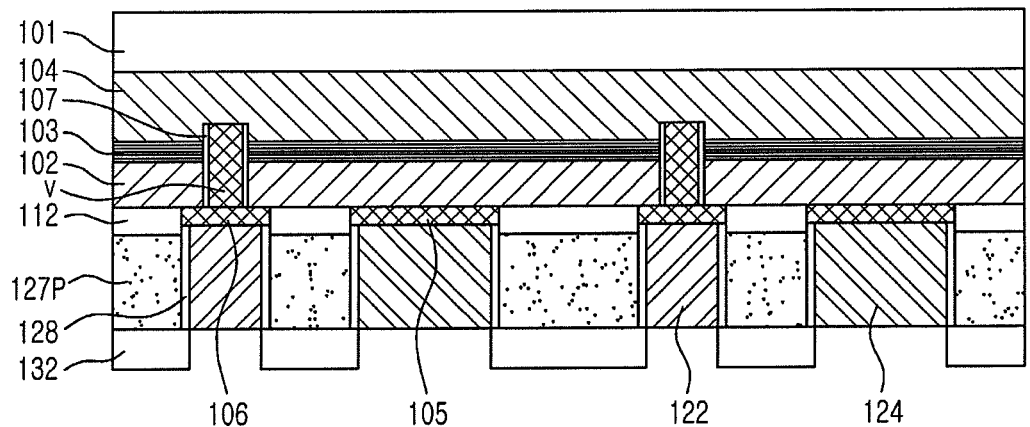

Referring to FIG. 7G, a process of forming the first and second support electrodes 122 and 124 on the first and second electrodes 105 and 106 exposed between the connection regions 127P may be performed. A first mask layer 132 may be formed to expose regions in which the first and second support electrodes 122 and 124 are to be formed, and the first and second support electrodes 122 and 124 may subsequently be formed through electroplating or sputtering. The first and second support electrodes 122 and 124 may comprise Cu, Al, Ag, Au, Ni, Cr, Pd, Cu, Pt, Sn, W, Rh, Ir, Ru, Mg, Zn, or alloys thereof, and may comprise a material having excellent electrical conductivity and heat conductivity and being readily adaptable for an electroplating process.

Although not shown, the first and second support electrodes 122 and 124 may include a diffusion preventing layer (i.e., an anti-diffusion layer or a barrier layer) formed before or following the formation of the first mask layer 132 and/or a seed layer for transmitting a current in the event of electroplating. The diffusion preventing layer and/or the seed layer may be configured to include a Ti layer/Cu layer by using a sputtering process, and in this case, each layer may have a thickness ranging from 50 nm to 500 nm. The other remaining portions of the first and second support electrodes 122 and 124 may be laminated, for example, as a Cu layer/Ni layer/Au layer each having a thickness ranging from 0.01 μm to 50 μm by using an electroplating process after the formation of the diffusion preventing layer and/or the seed layer. After the first and second support electrodes 122 and 124 are formed, the first mask layer 132 may be removed. According to an embodiment, the first and second support electrodes 122 and 124 may take a linear shape with lines connected to each other in one direction between adjacent light emitting device regions C on a wafer level.

In the case of the light emitting device package 100b of FIG. 3, the first mask layer 132 is formed such that peripheral regions of the connection regions 127P adjacent to the first and second support electrodes 122 and 124 are exposed, and the first and second support electrodes 122 and 124 are deposited such that they extend onto the connection regions 127P.

Figure 7H:
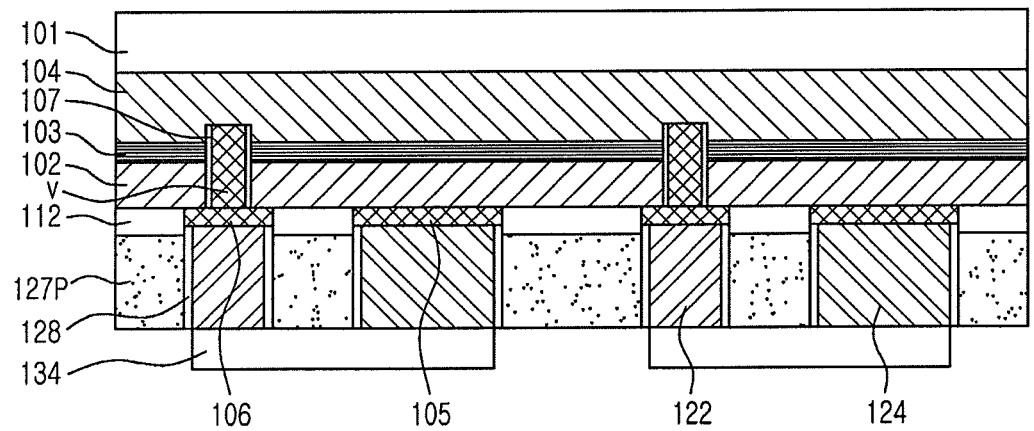

Referring to FIG. 7H, a process of forming a second mask layer 134 exposing the connection regions 127P positioned in an outer side of the first and second support electrodes 122 and 124 may be performed.

In the case of manufacturing the light emitting device package 100c according to an embodiment of the present inventive concepts illustrated in FIG. 4, in this process, the second mask layer 134 may be formed to allow even the connection regions 127P positioned between the first support electrode 122 and the second support electrode 124 to be exposed.

Also, in the case in which the first and second support electrodes 122 and 124 are formed to be connected to each other in one direction between the adjacent light emitting device regions C (please see FIG. 7A) according to an embodiment, the second mask layer 134 may be formed such that portions of the first and second support electrodes 122 and 124 are exposed in boundary regions of the light emitting device regions C in order to remove the first and second support electrodes 122 and 124 from the boundaries of the light emitting device regions C.

Figure 7I:
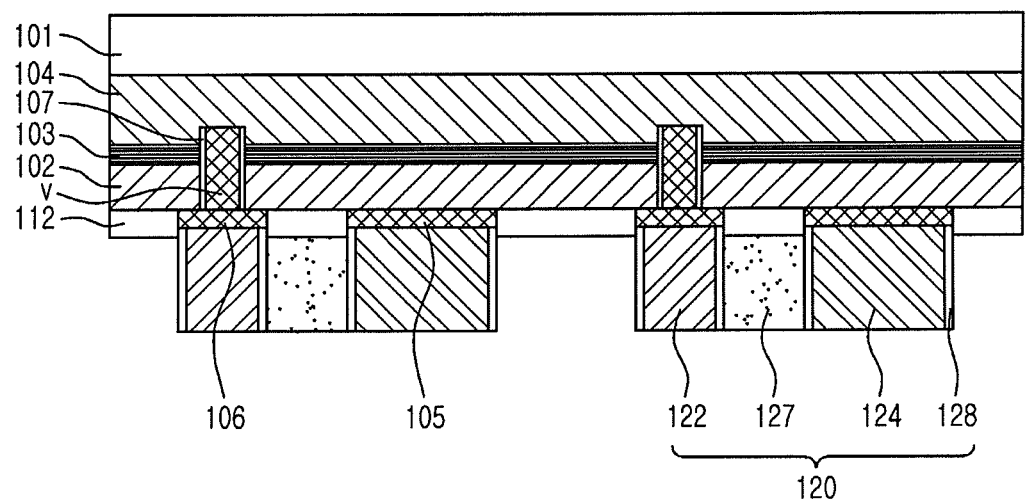

Referring to FIG. 7I, a process of removing the exposed connection regions 127P is performed. In this process, for example, a fluorine group such as $CF_4$, $SF_6$, or the like, a chlorine group such as $Cl_2$, $BCl_3$, or the like, or a plasma etchant gas such as argon (Ar), or the like, may be used, but the present inventive concepts are not limited thereto and various other etchant gases may also be applied. The support structure 120 including the first and second support electrodes 122 and 124 and the connection portion 127 may be formed. The support structure 120 may include the insulating layer 128. According to an embodiment, at least a portion of the insulating layer 128 positioned at an outer side of the first and second support electrodes 122 and 124 may be removed.

Also, according to an embodiment, a portion of the bonding layer 112 between adjacent support structures 120 may be removed by the light emitting device package unit to form a trench. In this case, a process of separating light emitting device package units can be facilitated.

With reference to FIG. 7i, by removing the connection region portions positioned between neighboring devices, the devices can be diced or separated more readily during subsequent steps. In some embodiments, this dicing can be accomplished without the need for cutting through silicon, as only a cut through oxide is required. This may simplify the cutting process, as only a single blade is needed, thereby reducing manufacturing costs and increasing yield and reliability.

Figure 7J:
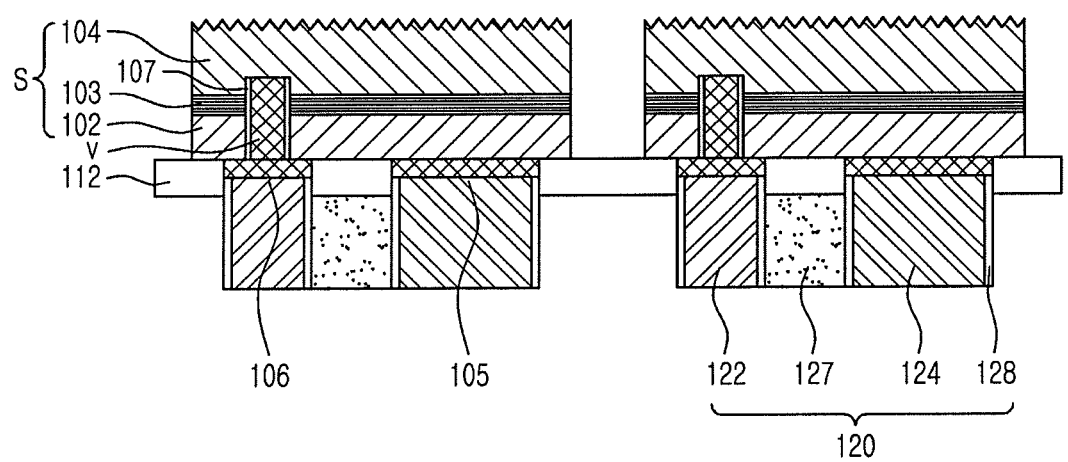

Referring to FIG. 7J, first, the substrate 101 may be removed. In a case in which the substrate 101 is made of a transparent material such as sapphire, the substrate 101 may be removed through a laser lift-off process, and in a case in which the substrate 101 is a silicon substrate, the substrate 101 may be removed through mechanical polishing, polishing, or wet or dry etching. In some embodiments, the substrate 101 is not removed. Also, in a case in which the support structure 120 has a relatively small thickness, for example, in a case in which the support structure 120 has a thickness ranging from 10 μm to 20 μm, at least a portion of the substrate 101 may be allowed to remain and a carrier substrate (not shown) may be attached to a lower portion of the support structure 120.

In some embodiments, thereafter, depressions and protrusions may be formed on an upper surface of the second conductivity-type semiconductor layer 104 in order to enhance light extraction efficiency. In a case in which the substrate 101 is not removed, depressions and protrusions may be formed on an upper surface of the substrate 101. The depressions and protrusions may be formed through, for example, mechanical cutting, polishing, wet etching, or dry etching using plasma. The depressions and protrusions may have a micro-concavo-convex pattern having a height ranging from 1.0 μm to 3.0 μm or a diameter ranging from 1.0 μm to 3.0 μm or a line pattern having a V-shaped recess.

Thereafter, a process of separating the light emitting laminates between adjacent support structures 120 is performed. Accordingly, a plurality of light emitting structures S may be formed. Before the separation process is performed, a passivation layer (not shown) having a thickness ranging from approximately 2200 Å to 2600 Å and covering at least a portion of the light emitting laminate may be formed. The depressions and protrusions may be formed after the process of separating the light emitting laminates is performed.

Figure 7K:
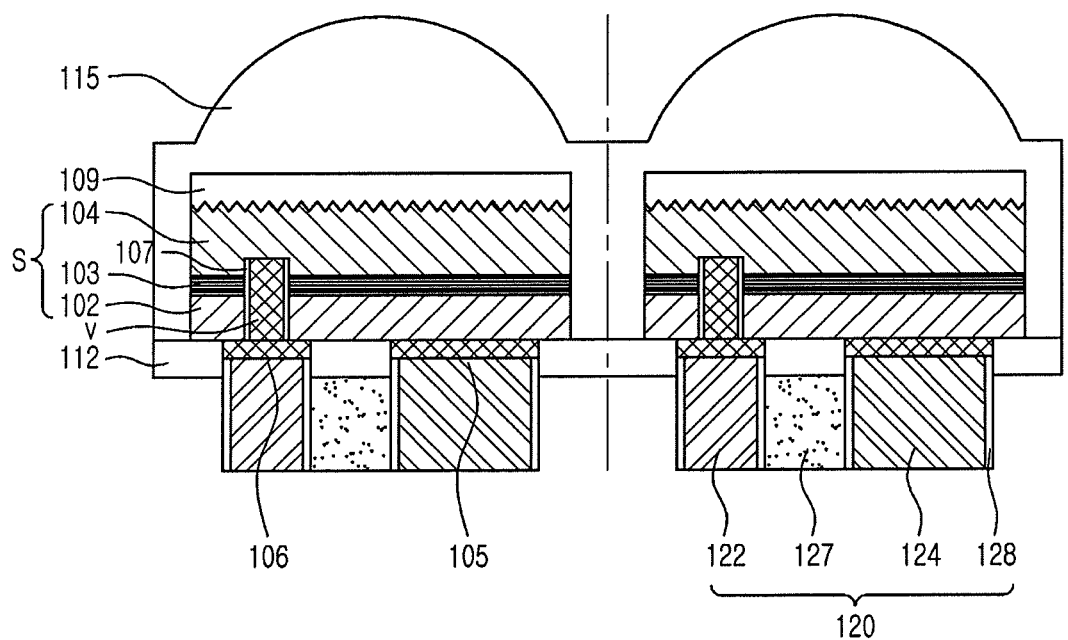

Referring to FIG. 7K, the wavelength conversion layer 109 and the lens unit 115 are formed on the light emitting structure S, and a separation process is performed along the alternated long and short dashed line by light emitting device packages 100 to finally form the light emitting device package 100 of FIG. 1A. The separation process may be performed through blade cutting or laser cutting. In performing the separation process, the cutting process is only performed on the bonding layer 112, so a problem such as chipping that may be generated in an interface in cutting a heterogeneous material can be prevented.

The wavelength conversion layer 109 may comprise a mixture of an oxide-based phosphor, a silicate-based phosphor, a nitride-based phosphor, a sulfide-based phosphor, or the like. In the case of an oxide-based material, yellow and green phosphors Y, Lu, Se, La, Gd, $Sm)_3(Ga, Al)_5O_{12}$:Ce and blue phosphors $BaMgAl_{10}O_{17}$:Eu, $3Sr_3 (PO_4)_2.CaCl$:Eu, and the like, may be used, and in the case of a silicate-based material, yellow and green phosphors $(Ba, Sr)_2SiO_4$:Eu, yellow and orange phosphors $(Ba, Sr)_3SiO_5$:Eu, and the like, may be used. Also, in the case of a nitride-based material, green phosphors β-SiAlON:Eu, yellow phosphors $La, Gd, Lu, Y, Sc)_3Si_6N_{11}$:Ce, orange phosphors α-SiAlON:Eu, red phosphors $(Sr, Ca)AlSiN_3$:Eu, $(Sr, Ca)AlSi(ON)_3$:Eu, $(Sr, Ca)_2Si_5N_8$:Eu, $(Sr, Ca)_2Si_5(ON)_8$:Eu, $(Sr, Ba)SiAl_4N_7$:Eu, and the like, may be used, and in the case of a sulfide-based material, red phosphors $(Sr, Ca)S$:Eu and $(Y, Gd)_2O_2S$:Eu, green phosphors $SrGa_2S_4$:Eu, and the like, may be used.

Phosphor compositions constituting the wavelength conversion layer 109 should basically conform to Stoichiometry, and respective elements may be substituted with different elements of respective groups of the periodic table. For example, strontium (Sr) may be substituted with barium (Ba), calcium (Ca), magnesium (Mg), or the like, of alkali earth elements, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics. Also, materials such as quantum dots (QD), or the like, may be applied as materials that replace phosphors, and phosphors and quantum dots may be used in combination or alone in an LED. A quantum dot (QD) may have a structure including a core (3 to 10 nm) such as CdSe, InP, or the like, a shell (0.5 to 2 nm) such as ZnS, ZnSe, or the like, and a ligand for stabilizing the core and the shell, and may implement various colors according to sizes. Phosphors or quantum dots may be applied by using at least one of a method of spraying them, a method of covering as a film, and a method of attaching as a sheet of ceramic phosphor, or the like.

The lens unit 115 may be formed by attaching a previously formed lens, by injecting an organic solvent having fluidity into to a mold in which the light emitting structure S is mounted and solidifying the same, or the like. Light distribution characteristics may be changed according to a shape (concave, convex, concavo-convex, conical, and geometrical structure) of the lens unit 115, so the shape of the lens unit 115 may be modified according to efficiency and the necessity of light distribution characteristics.

FIGS. 8A through 8D are cross-sectional views illustrating sequential processes of manufacturing a light emitting device package according to an embodiment of the present inventive concepts.

Figure 8A:
FIGS. 8A through 8D are cross-sectional views illustrating sequential processes of manufacturing a light emitting device package according to an embodiment of the present inventive concepts.

Referring to FIG. 8A, a connection substrate 127S is prepared, and process of removing regions of the connection substrate 127S corresponding to the first and second support electrodes 122 and 124 illustrated in FIG. 1A by a predetermined depth is performed. The removal process may be performed through, for example, dry etching.

Figure 8B:
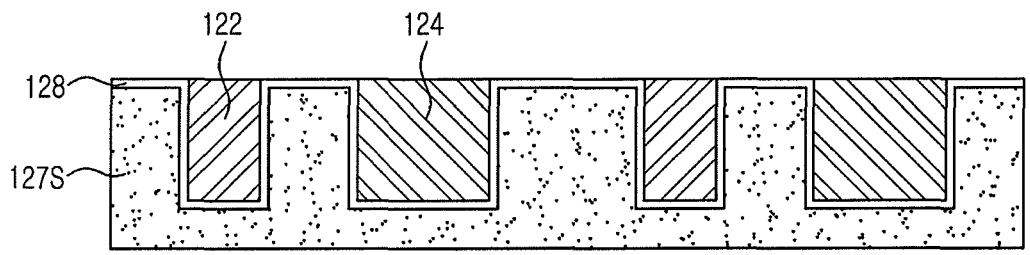

Referring to FIG. 8B, an insulating layer 128 may be formed within the etched regions of the connection substrate 127S. Thereafter, a process of forming the first and second support electrodes 122 and 124 on the insulating layer 128 may be performed. The regions in which the first and second support electrodes 122 and 124 are to be formed are exposed by forming a mask layer (not shown), and electroplating or sputtering may be performed thereon to form the first and second support electrodes 122 and 124. Although not shown, a diffusion preventing layer and/or a seed layer for transmitting a current in the event of electroplating may be formed before the formation of the first and second support electrodes 122 and 124.

Figure 8C:
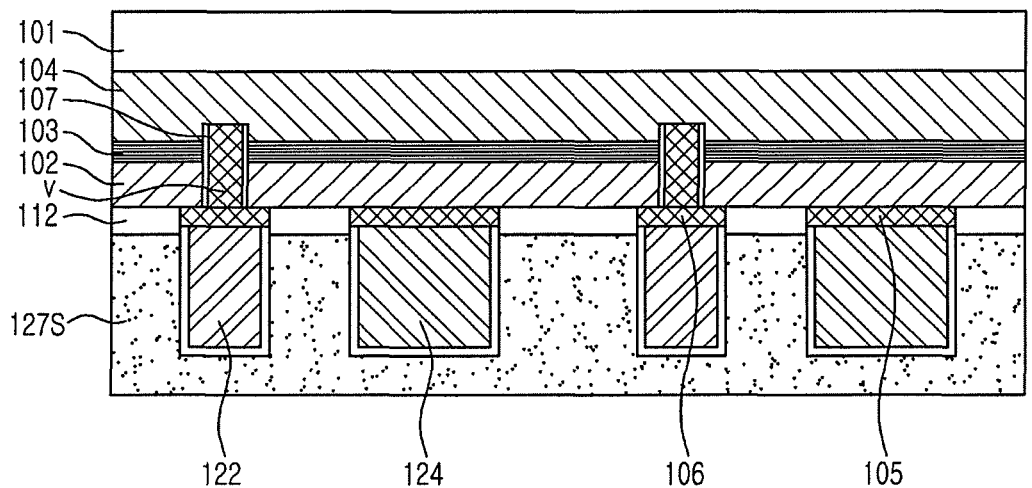

Referring to FIG. 8C, a process of bonding the substrate 101 including the light emitting laminate formed thereon as illustrated in FIG. 7B and the connection substrate 127S with the first and second support electrodes 122 and 124 formed thereon may be performed. Through this process, the first support electrode 122 may be connected to the second electrode 106, and the second support electrode 124 may be connected to the first electrode 105.

The bonding layer 112' (please see FIG. 7B) on the substrate 101 may be bonded to a portion of the insulating layer 128 on the connection substrate 127S or a substrate bonding layer (not shown) to finally form the bonding layer 112 of FIG. 8C.

Figure 8D:
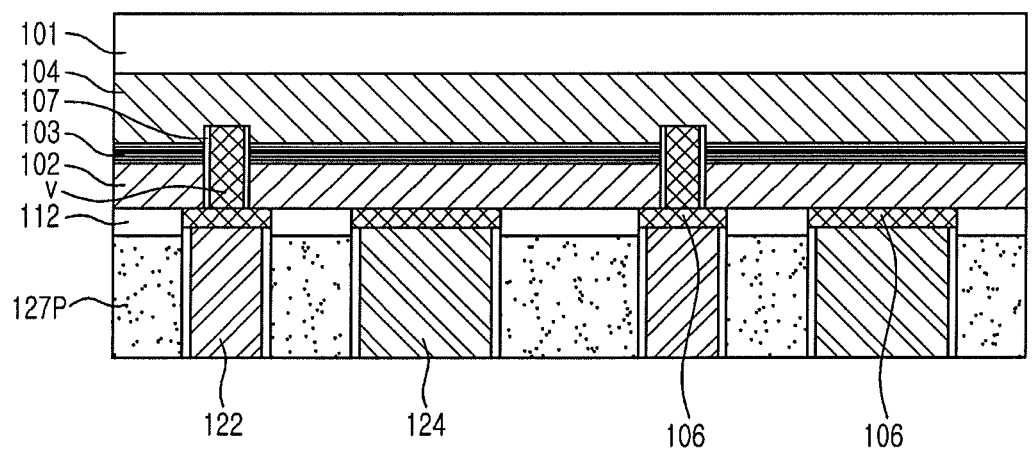

Referring to FIG. 8D, a process of thinning the connection substrate 127S is performed to allow the first and second support electrodes 122 and 124 to be exposed from the lower surface of the connection substrate 127S. According to an embodiment, the thinning process may be performed before the foregoing bonding process described above with reference to FIG. 8C.

Figure 9:
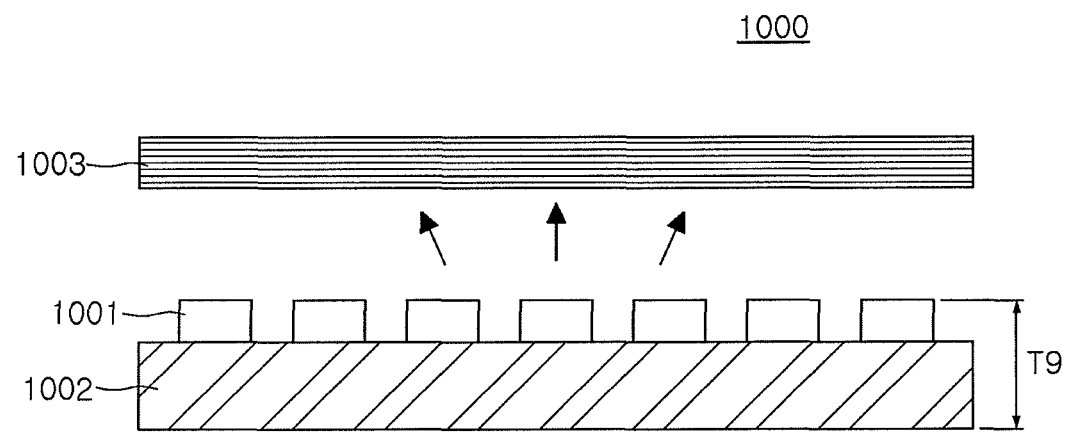
FIGS. 9 and 10 are views illustrating an example in which a light emitting device package according to an embodiment of the present inventive concepts is applied to a backlight unit.
Figure 10:
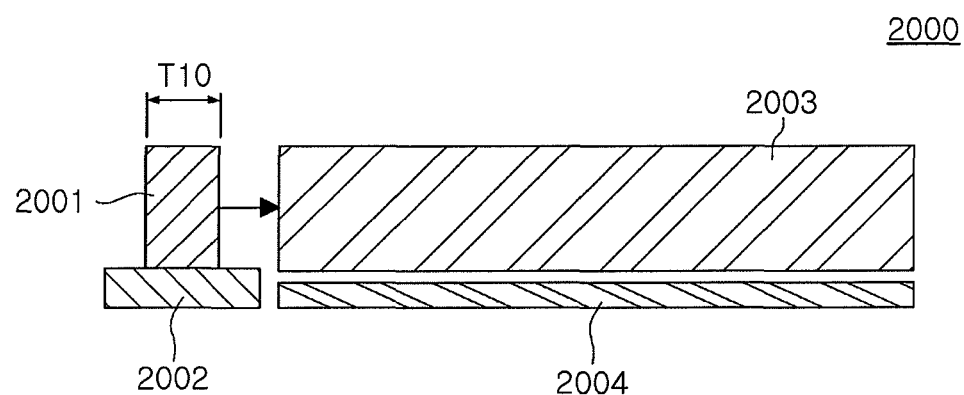

Thereafter, the process as described above with reference to FIGS. 7H to 7K is performed in the same manner to form the light emitting device package 100 illustrated in FIG. 1A FIGS. 9 and 10 are views illustrating an example in which a light emitting device package according to an embodiment of the present inventive concepts is applied to a backlight unit.

Referring to FIG. 9, in a backlight unit 1000, light sources 1001 are mounted on a substrate 1002, and one or more optical sheets 1003 are disposed thereabove. As the light sources 1001, a light emitting device package having the structure as described above with reference to FIGS. 1 and 2 through 6 or a similar structure may be used, and also, the light sources 1001 may be mounted directly on the substrate 1002 in a state before the light emitting device packages are separated in the manufacturing process of the light emitting device package described above with reference to FIG. 7K. By directly mounting the light sources 1001 configured as the light emitting device packages illustrated in FIGS. 1A and 2 through 6 on the substrate 1002, a slim backlight unit having excellent heat dissipation effect and having a reduced ninth thickness T9 as an overall thickness of the light sources 1001 and the substrate 1002 can be implemented.

In the backlight unit 1000 illustrated in FIG. 9, the light sources 1001 emit light toward an upper side where an LCD is disposed, but in comparison, in a backlight unit 2000 according to another example illustrated in FIG. 10, a light source 2001 mounted on a substrate 2002 emits light in a lateral direction, and the emitted light is made incident to a light guide plate 2003 so as to be transformed into a surface light source. Light passing through the light guide plate 2003 is emitted upwardly, and in order to enhance light extraction efficiency, a reflective layer 2004 may be disposed under the light guide plate 2003. By mounting the light source 2001 configured as a light emitting device package directly on the substrate 2002, a backlight unit having a slim bezel, having excellent heat dissipation effect, and having a reduced tenth thickness T10 as an overall thickness of the light source 2001 and the substrate 2002 can be implemented.

Figure 11:
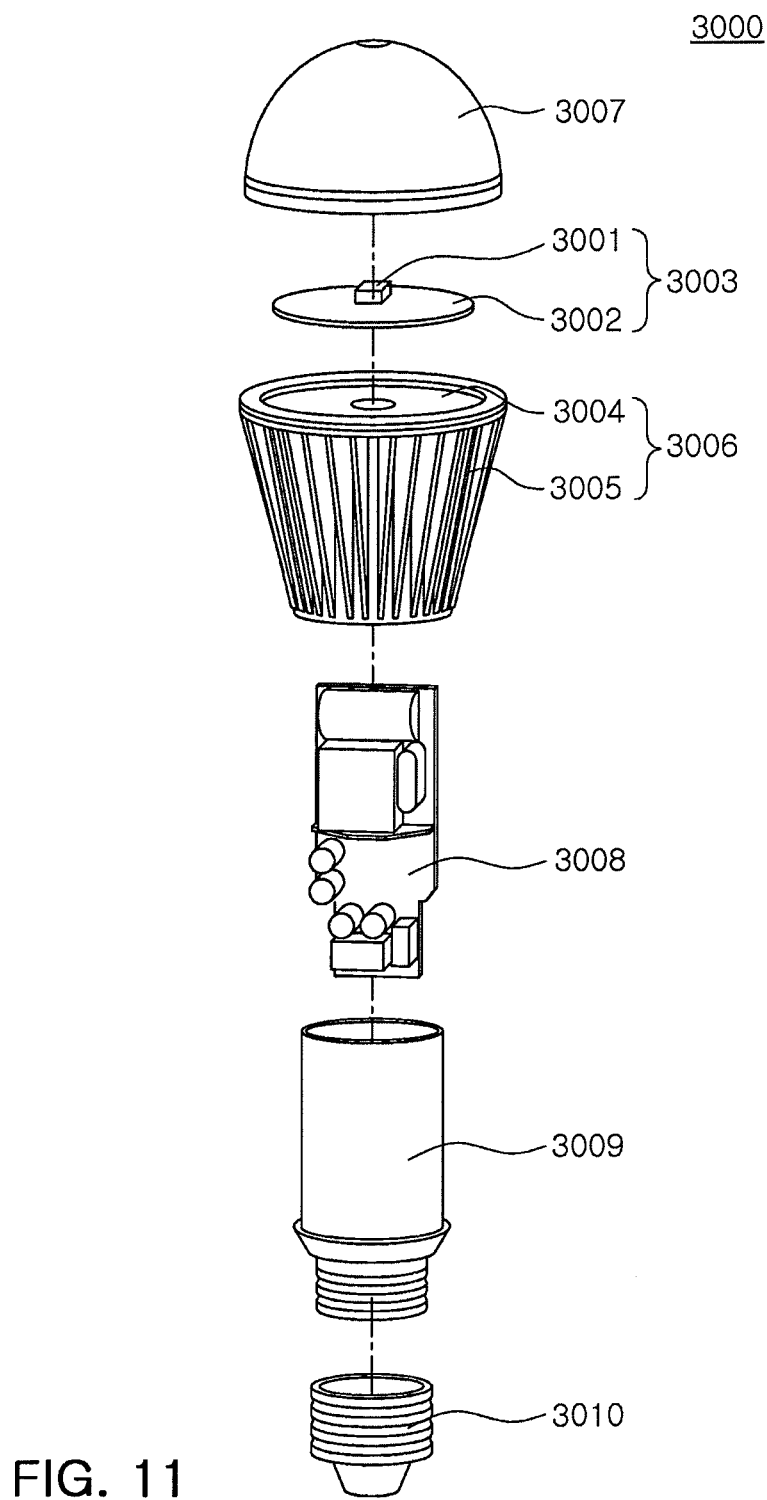
FIG. 11 is a view illustrating an example in which a light emitting device package according to an embodiment of the present inventive concepts is applied to a lighting device.

FIG. 11 is a view illustrating an example in which a light emitting device package according to an embodiment of the present inventive concepts is applied to a lighting device.

Figure 12:
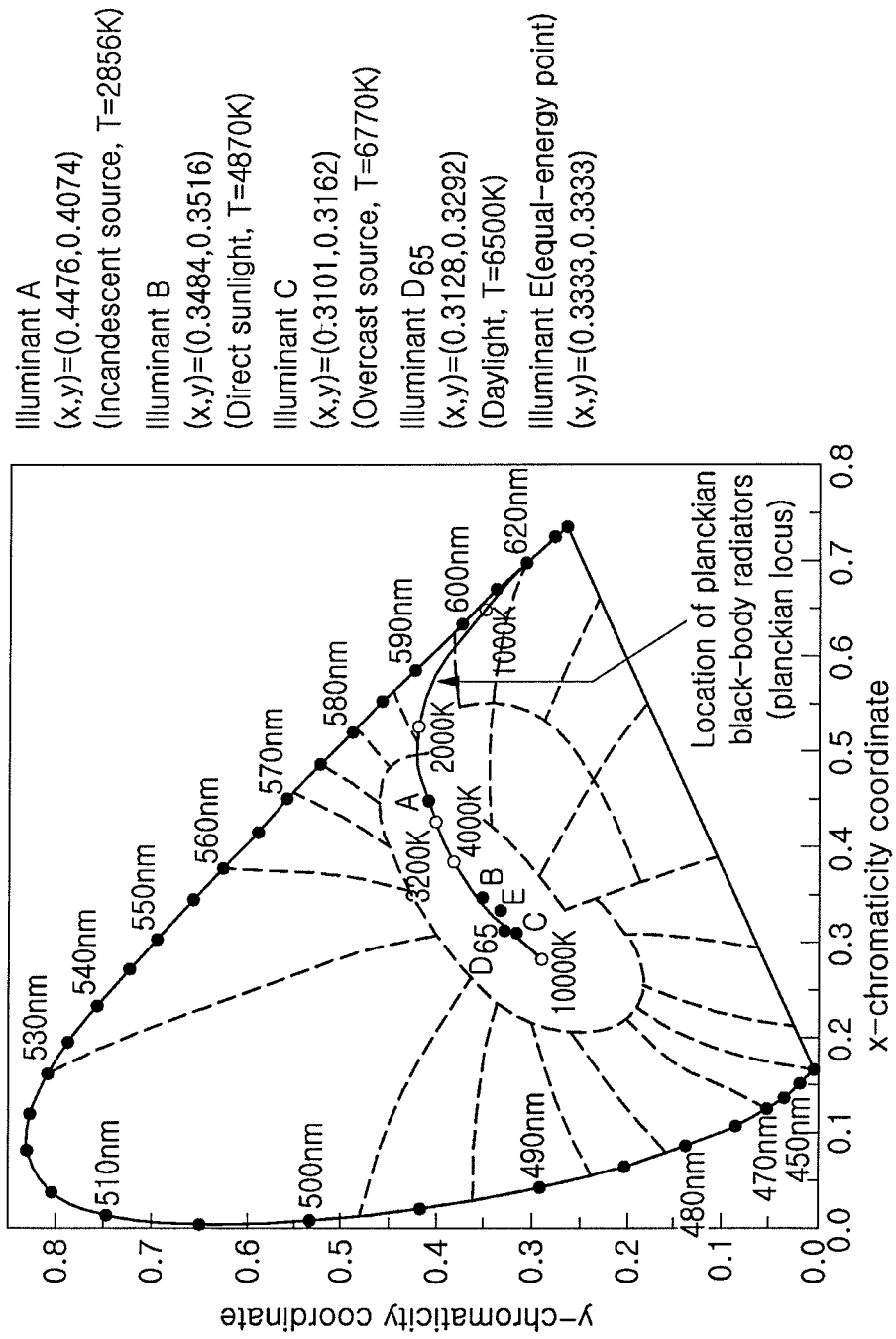
FIG. 12 is a CIE 1931 chromaticity diagram showing a full radiation spectrum.

FIG. 12 is a CIE 1931 chromaticity diagram showing a full radiation spectrum.

Referring to the exploded perspective view of FIG. 11, a lighting device 3000 is illustrated as, for example, a bulb type lamp, including a light emitting module 3003, a driving unit 3008, and an external connection unit 3010. Also, the lighting device 3000 may further include external structures such as external and internal housings 3006 and 3009 and a cover unit 3007. The light emitting module 3003 may include a light emitting device package 3001, any one of those illustrated in FIGS. 2 through 6, and a circuit board 3002 on which the light emitting device package 3001 is mounted. In the present embodiment, a single light emitting device package 3001 is illustrated as being mounted on the circuit board 3002, but the present inventive concepts is not limited thereto and a plurality of light emitting device packages may be mounted as necessary.

In this case, the plurality of light emitting device packages 3001 may be homogeneous packages generating light beams having the same wavelength, or the plurality of light emitting device packages 3001 may be heterogeneous packages generating light beams having different wavelengths. Namely, the plurality of light emitting device packages 3001 may be variously configured. For example, the plurality of light emitting device packages 3001 may be configured to include at least one of a light emitting element emitting white light by combining green, red, and orange phosphors to a blue LED chip and a purple, blue, green, red, and infrared light emitting element. In this case, the lighting device 3000 may have a color rendering index (CRI) adjusted to range from natrium (Na) lamp 40 level to a sunlight level, or the like, and have a color temperature ranging from candlelight (1500K) to a blue sky (12000K) level to generate various white light beams. If necessary, the light source apparatus may generate visible light having purple, blue, green, red, orange colors, or infrared light to adjust an illumination color according to a surrounding atmosphere or mood. Also, the light source apparatus may generate light having a special wavelength stimulating plant growth.

White light generated by combining yellow, green, red phosphors and/or green and red LED chips and a red LED CHIP may have two or more peak wavelengths and may be positioned in a segment linking (x,y) coordinates (0.4476, 0.4074), (0.3484, 0.3516), (0.3101, 0.3162), (0.3128, 0.3292), (0.3333, 0.3333) of a CIE 1931 chromaticity diagram. Alternatively, white light may be positioned in a region surrounded by a spectrum of black body radiation and the segment. A color temperature of white light corresponds to a range from 2000K to 20000K.

Also, in the lighting device 3000, the light emitting module 3003 may include an external housing 3006 serving as a heat dissipation unit, and the external housing 3006 may include a heat dissipation plate 3004 disposed to be in direction contact with the light emitting module 3003 to enhance a heat dissipation effect and a heat dissipation fins 3005 surrounding lateral surfaces of the light emitting device 3000. Also, the lighting device 3000 may include a cover unit 3007 installed on the light emitting module 3003 and having a convex lens shape. The driving unit 3008 may be installed in the internal housing 3009 and connected to an external connection unit 3010 having a socket structure to receive power from an external power source. Also, the driving unit 3008 may serve to convert received power into an appropriate current source for driving the semiconductor light emitting device 3001 of the light emitting module 3003 and provide the same. For example, the driving unit 3008 may be configured as an AC-DC converter, a rectifier circuit component, or the like. Also, the lighting device 3000 may include a communications module.

Figure 13A:
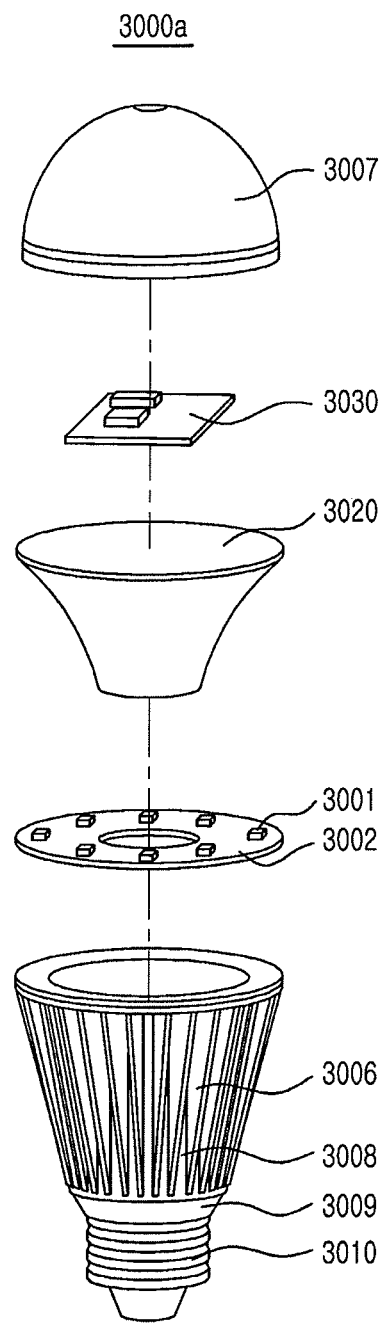
FIG. 13A is a view illustrating an example in which a light emitting device package according to an embodiment of the present inventive concepts is applied to a lighting device including a communications module.

FIG. 13A is a view illustrating an example in which a light emitting device package according to an embodiment of the present inventive concepts is applied to a lighting device including a communications module.

Figure 13B:
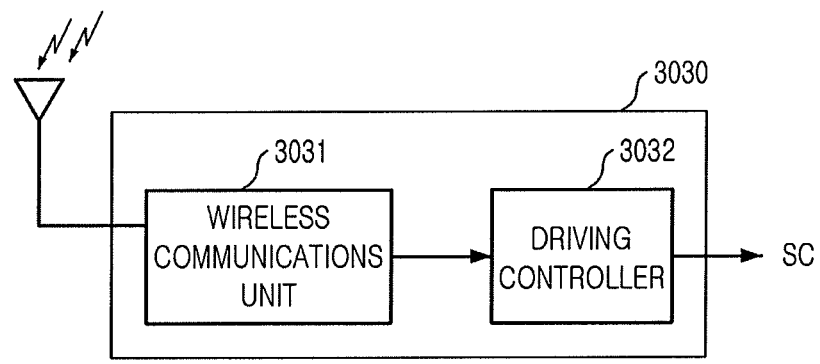
FIG. 13B is a view illustrating a configuration of a communications module installed in a light emitting device of FIG. 13A.

FIG. 13B is a view illustrating a configuration of a communications module installed in a light emitting device of FIG. 13A.

Figure 13C:
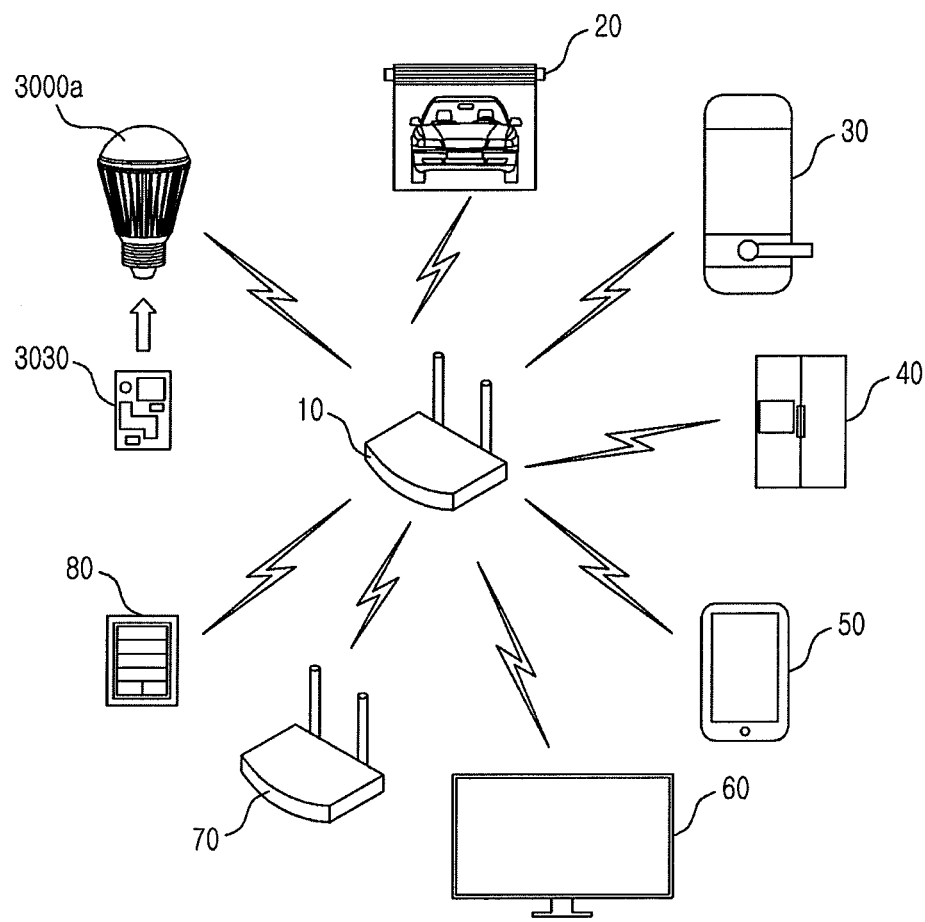
FIG. 13C is a view illustrating an example of wireless communications using the light emitting device of FIG. 13A.

FIG. 13C is a view illustrating an example of wireless communications using the light emitting device of FIG. 13A.

Referring to the explosive perspective view of FIG. 13A, unlike the lighting device 3000 of FIG. 11, a lighting device 3000a further includes a reflective plate 3020 positioned in an upper portion of the light emitting module 3003. The reflective plate 3020 may serve to evenly spread light from the light emitting module 3003 laterally and backwardly, reducing dazzle or glare.

A communications module 3030 may be installed in an upper portion of the reflective plate 3020, and home network communications may be performed through the communications module 3030. By utilizing household wireless communications such as ZigBee™, WiFi, or the like, through the communications module 3030, illumination brightness may be automatically adjusted according to an operational state in a bedroom, living room, front door, warehouse, home appliances, or the like, and a surrounding environment.

Referring to FIG. 13B, the communications module 3030 installed in the light emitting device of FIG. 13A may include a wireless communications unit 3031 generating a dimming signal according to a wireless control signal received according to a pre-set wireless communications protocol and a driving controller 3032 generating a pulse-width-modulated light emission driving control signal SC by comparing the dimming signal with a pre-set reference signal having a triangular waveform. Here, the wireless communications protocol for the communications module 3030 may be the IEEE 802.15.4 protocol corresponding to a ZigBee communications protocol.

The wireless communications unit 3031 may generate the dimming signal and output the same to the driving controller 3032, and the driving controller 3032 may generate the light emission driving control signal SC and output the same to the driving unit 3008. The driving controller 3032 may be, for example, a micro-controller unit (MCU).

According to an embodiment, the communications module 3030 may be modularized so as to be integrated with an optical sensor, and may be configured to be integrated with the lighting device 3000a.

Referring to FIG. 13C, an example of performing home network communications by utilizing the communications module 3030 of the lighting device 3000a is illustrated. The communications module 3030 may be, for example, a ZigBee™ module. For household wireless communications, a signal from the lighting device 3000a may be transmitted to household devices such as a garage door opening and closing device 20, a door lock 30, a home appliance 40, a cellular phone 50, a TV 60, a router 60, a general illumination switch 70, and the like, through a gateway hub 10, whereby the household devices can be controlled. Also, the lighting device 3000a may be controlled by signals from the household devices. Thus, the household devices may also include a communications module for wireless communications such as ZigBee™ and/or Wi-Fi. According to an embodiment, communications may be performed with the household devices without the gateway hub 10.

Also, the lighting device 3000a may detect a type of a channel or a program of the TV 60 on the air (currently aired or broadcast) or detect brightness of the screen of the TV 60, and brightness of the lighting device 3000a may be automatically controlled accordingly. For example, when a drama TV show, or the like, is broadcast and a dim atmosphere is required, a color sense of illumination of the lighting device 3000a is controlled such that a color temperature is lowered to below 12000K according to the atmosphere. Reversely, in case of a light atmosphere such as a light entertainment TV program, a color temperature of illumination of the lighting device 3000a is also increased to above 12000K to provide white illumination based on blue color.

Figure 14:
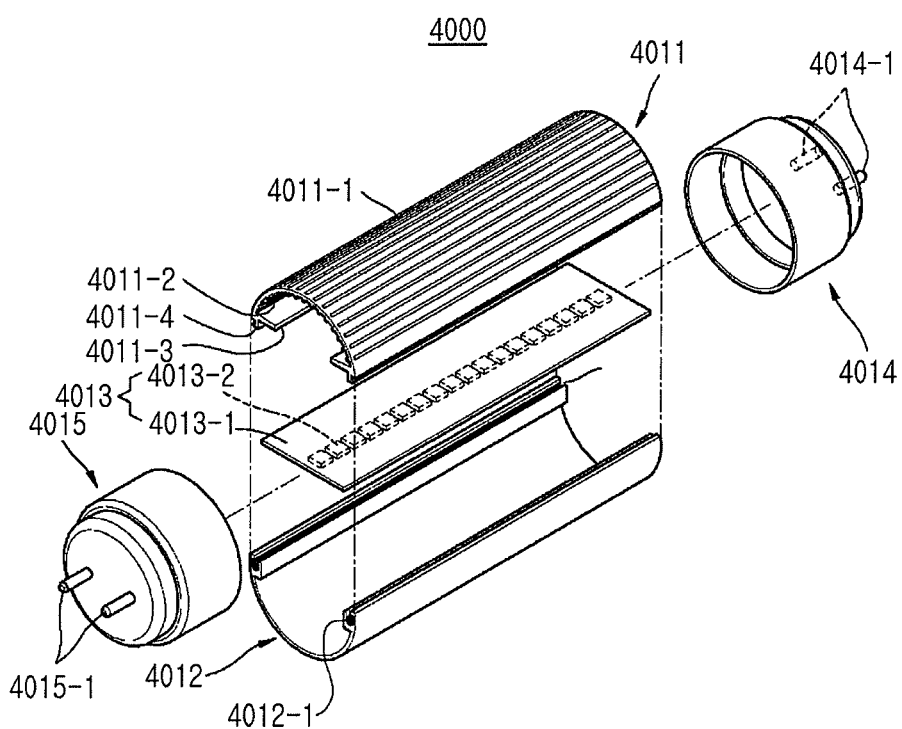
FIG. 14 is a view illustrating an example in which a light emitting device package according to an embodiment of the present inventive concepts is applied to an optical sensor-incorporated tubular light emitting device.

FIG. 14 is a view illustrating an example in which a light emitting device package according to an embodiment of the present inventive concepts is applied to an optical sensor-incorporated tubular light emitting device Referring to the exploded perspective view of FIG. 14, an optical sensor-integrated tubular lighting device 4000 includes a heat dissipating member 4011, a cover 4012, a light emitting module 4013, a first socket 4014, and a second socket 4015.

The heat dissipating member 4011 includes a plurality of heat dissipating fins 4011-1 and 4011-2 formed on inner or/and outer surfaces thereof in a concavo-convex manner. The heat dissipating fins 4011-1 and 4011-2 may be designed to have various shapes and intervals therebetween. A support 4011-3 as a protrusion is formed in an inner side of the heat dissipating member 4011. The light emitting module 4013 may be fixed to the support 4011-3. Stopping protrusions 4011-4 may be formed on both ends of the first cover 4011.

A stopping recess 4012-1 is formed on the cover 4012, and the stopping protrusion 4011-4 of the heat dissipating member 4011 may be coupled to the stopping recess 4012-1 in a hook-coupling manner. For example, the positions of the stopping recess 4012-1 and the stopping protrusion 4011-4 may be interchangeable.

The light emitting module 4013 may include a printed circuit board (PCB) 4013-1 and an LED array 4013-2. The LED array 4013-2 may include a plurality of light emitting device packages, one of those illustrated in FIGS. 1A and 2 through 6, arranged thereon. Circuit wirings are formed on the PCB 4013-1 in order to operate the LED array 4013-2. Also, circuit components for operating the LED array 4013-2 may be provided.

The first and second sockets 4014 and 4015 are a pair of sockets and coupled to both ends of a cylindrical cover unit including the heat dissipating member 4011 and the cover 4012.

For example, an electrode terminal 4014-1 is disposed in the first socket 4014, and a dummy terminal 4015-1 may be disposed in the second socket 4015. An optical sensor module may be installed in any one of the first socket 4014 and the second socket 4015.

For example, an optical sensor module may be installed in the second socket 4015 with the dummy terminal 4015-1 disposed therein. In another example, an optical sensor module may be installed in the first socket 4014 with the electrode terminal 4014-1 disposed therein. Also, in another example, an optical sensor module may be installed in the second socket 4015 with the dummy terminal 4015-1 disposed therein and a power source device may be installed in the first socket 4014 with the electrode terminal 4014-1 disposed therein.

Figure 15:
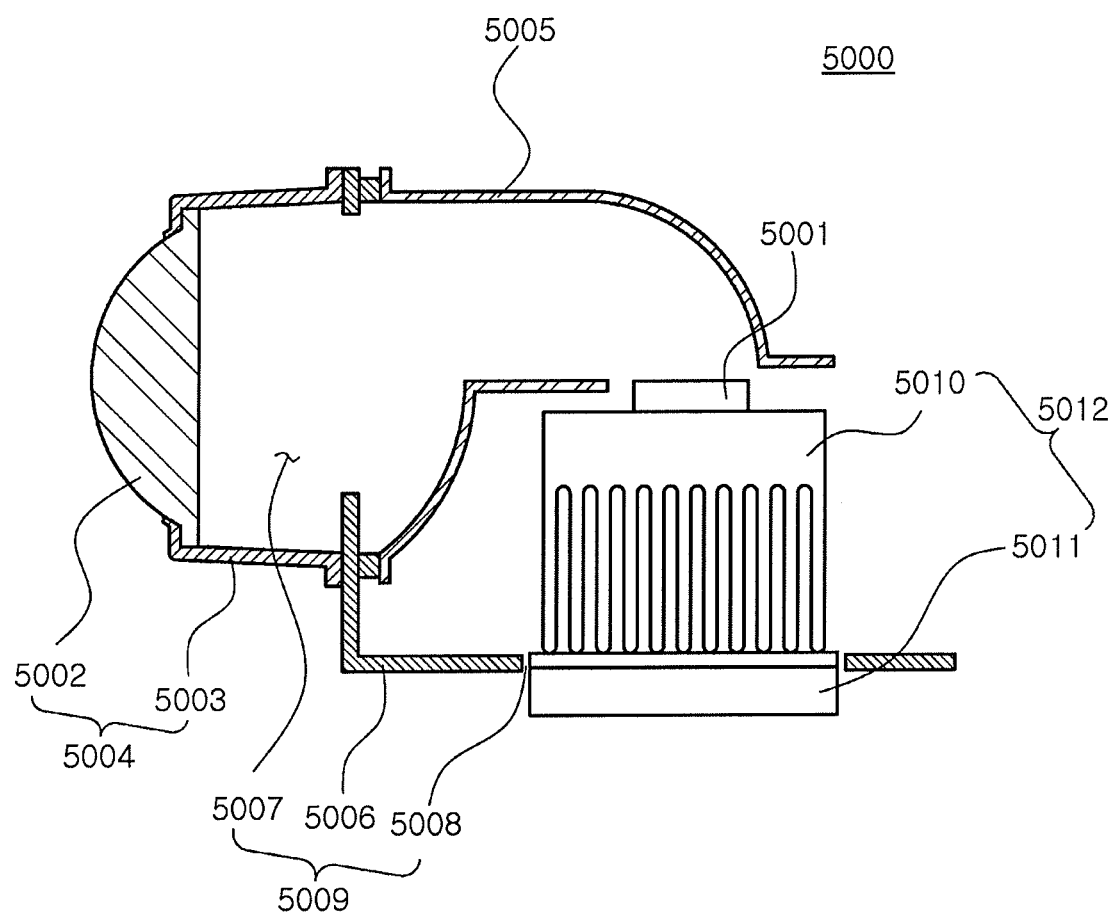
FIG. 15 is a view illustrating an example in which a light emitting device package according to an embodiment of the present inventive concepts is applied to a head lamp.

FIG. 15 is a view illustrating an example in which a light emitting device package according to an embodiment of the present inventive concepts is applied to a head lamp.

Referring to FIG. 15, a head lamp 5000 used as a vehicle lamp, or the like, may include a light source 5001a reflective unit 5005, and a lens cover unit 5004. The lens cover unity 5004 may include a hollow guide 5003 and a lens 5002. The light source 5001 may include at least one of the any one of the light emitting device packages illustrated in FIGS. 1A and 2 through 6. Also, the head lamp 5000 may further include a heat dissipation unit 5012 dissipating heat generated by the light source 5001 outwardly. In order to effectively dissipate heat, the heat dissipation unit 5012 may include a heat sink 5010 and a cooling fan 5011. Also, the head lamp 5000 may further include a housing 5009 fixedly supporting the heat dissipation unit 5012 and the reflective unit 5005, and the housing 5009 may have a central hole 5008 formed on one surface thereof, in which the heat dissipation unit 5012 is coupled. Also, the housing 5009 may have a front hole 5007 formed on the other surface integrally connected to the one surface and bent in a right angle direction. The front hole 5007 may allow the reflective unit 5005 to be fixedly positioned above the light source 5001. Accordingly, a front side is opened by the reflective unit 5005, and the reflective unit 5005 is fixed to the housing 5009 such that the opened front side corresponds to the front hole 5007, and light reflected by the reflective unit 5005 may pass through the front hole 5007 so as to be output outwardly.

As set forth above, according to embodiments of the inventive concepts, a light emitting device package implementable as a micro-package and having excellent heat dissipation characteristics can be provided.

While the present inventive concepts have been shown and described in connection with the embodiments, it will be apparent to those skilled in the art that modifications and variations can be made without departing from the spirit and scope of the inventive concepts as defined by the appended claims.

What is claimed is:

1. A light emitting device package, comprising:
a light emitting structure including semiconductor layers comprising:
a first semiconductor layer of a first conductivity type;
an active layer on the first semiconductor layer; and
a second semiconductor layer on the active layer, the second semiconductor layer of a second conductivity type that is different than the first conductivity type;
the first semiconductor layer, second semiconductor layer and active layer having substantially similar width dimensions;
a first electrode electrically connected to the first semiconductor layer and a second electrode electrically connected to the second semiconductor layer, the first and second electrodes being insulated from each other; and
a support structure, the first and second electrodes located between the light emitting structure and the support structure, the support structure comprising:
a first support electrode electrically connected to the first electrode;
a second support electrode electrically connected to the second electrode, the second support electrode spaced apart from, and electrically insulated from, the first support electrode; and
a support connection portion between the first support electrode and the second support electrode,
wherein the light emitting structure includes a protrusion portion that protrudes in a horizontal direction beyond outer sidewalls of both the first support electrode and the second support electrode so that a void is present below the protrusion portion and above a plane extending from bottoms of the first and second support electrodes, and
wherein the first and second electrodes are at a common surface of the light emitting structure.

2. The light emitting device package of claim 1 wherein the light emitting structure has a first width in the horizontal direction, and wherein the support structure has a second width in the horizontal direction and wherein the first width is greater than the second width.

3. The light emitting device package of claim 1 wherein the light emitting structure includes a lens unit package on, and at sidewalls of, the light emitting structure, and wherein the lens unit package has a first width in the horizontal direction and wherein the support structure has a second width in the horizontal direction and wherein the first width is greater than the second width.

4. The light emitting device package of claim 1 wherein the light emitting structure has a first width in a first horizontal direction, wherein the support structure has a second width in the first horizontal direction and wherein the second width is of a value that is in a range of about 0.65 to about 0.95 times the first width.

5. The light emitting device package of claim 2 wherein the first and second support electrodes have a combined third width in a first horizontal direction, wherein the support connection portion has a fourth width in the first horizontal direction and wherein the combined third width is greater than the fourth width.

6. The light emitting device package of claim 1 wherein the first and second support electrodes have a first height in a vertical direction and wherein the support connection portion has a second height in the vertical direction and wherein the first height is greater than the second height.

7. The light emitting device package of claim 1 wherein the first and second support electrodes have a first height in a vertical direction and wherein the light emitting structure has a third height in the vertical direction and wherein the first height is greater than the third height.

8. The light emitting device package of claim 1 wherein the first and second support electrodes are unitary between sidewalls thereof.

9. The light emitting device package of claim 1 wherein the support connection portion comprises a first material, and wherein a region at a sidewall of the at least one first and second support electrodes and below the protrusion portion is devoid of the first material.

10. The light emitting device package of claim 1 wherein the support connection portion comprises a first material, and wherein the first material is formed on outer sidewalls of the at least one first and second support electrodes.

11. The light emitting device package of claim 1 further comprising an insulating layer between inner sidewalls of the first and second support electrodes and the support connection portion.

12. The light emitting device package of claim 1 further comprising an insulating layer at outer sidewalls of the first and second support electrodes.

13. The light emitting device package of claim 1 wherein regions of outer sidewalls of the first and second support electrodes are devoid of a material coating.

14. The light emitting device package of claim 1 wherein the first support electrode and the second support electrode extend in a first horizontal direction of extension and are parallel to each other in the first horizontal direction.

15. The light emitting device package of claim 1 wherein the first support electrode and the second support electrode are substantially rectangular in horizontal cross section, and wherein at least two sidewalls of at least one of the first support electrode and the second support electrode are covered by the support connection portion.

16. The light emitting device package of claim 1 wherein the first support electrode and the second support electrode have a tapered cross-section so that they are wider at a bottom portion distal the light emitting structure and narrower at a top portion proximal the light emitting structure.

17. The light emitting device package of claim 16 wherein the support connection portion has a tapered cross-section that is wider at a top portion proximal the light emitting structure and narrower at a bottom portion distal the light emitting structure.

18. The light emitting device package of claim 1 wherein at least one of the first support electrode and the second support electrode includes an extension portion, and wherein the support connection portion is on the extension portion.

19. The light emitting device package of claim 1 further comprising a wavelength conversion layer on the second semiconductor layer.

20. The light emitting device package of claim 1 further comprising an electrode via extending in a vertical direction between the second electrode and the second semiconductor layer.

21. The light emitting device package of claim 1 wherein the light emitting structure comprises a light emitting nanostructure.

22. The light emitting device package of claim 1 wherein the first and second electrodes of the light emitting structure are on the support structure.

23. A light emitting device package, comprising:
a light emitting structure including semiconductor layers comprising:
a first semiconductor layer of a first conductivity type;
an active layer on the first semiconductor layer; and
a second semiconductor layer of a second conductivity type on the active layer;
the first semiconductor layer, second semiconductor layer and active layer having substantially similar width dimensions;
a first electrode electrically connected to the first semiconductor layer and a second electrode electrically connected to the second semiconductor layer, the first and second electrodes being insulated from each other; and
a support structure, the first and second electrodes located between the light emitting structure and the support structure, the support structure comprising:
a first support electrode electrically connected to the first electrode;
a second support electrode electrically connected to the second electrode, the second support electrode spaced apart from, and electrically insulated from, the first support electrode; and
a support connection portion between the first support electrode and the second support electrode,
wherein the light emitting structure includes a protrusion portion that protrudes in a horizontal direction beyond outer sidewalls of both the first support electrode and the second support electrode so that a void is present below the protrusion portion and above a plane extending from bottoms of the first and second support electrodes, and
wherein the light emitting structure has a first width in a first horizontal direction, the support structure has a second width in the first horizontal direction, and the first width is greater than the second width.

24. A light emitting device package, comprising:
a light emitting structure including semiconductor layers comprising:
a first semiconductor layer of a first conductivity type;
an active layer on the first semiconductor layer; and
a second semiconductor layer of a second conductivity type on the active layer;
the first semiconductor layer, second semiconductor layer and active layer having substantially similar width dimensions;
a first electrode electrically connected to the first semiconductor layer and a second electrode electrically connected to the second semiconductor layer, the first and second electrodes being insulated from each other; and
a support structure, the first and second electrodes located between the light emitting structure and the support structure, the support structure comprising:
a first support electrode electrically connected to the first electrode;
a second support electrode electrically connected to the second electrode, the second support electrode spaced apart from, and electrically insulated from, the first support electrode; and
a support connection portion between the first support electrode and the second support electrode and comprised of a semiconductor material; and
an insulating layer positioned on lateral surfaces of the first and second support electrodes, and insulating the first and second support electrodes from the support connection portion;

wherein the light emitting structure includes a protrusion portion that protrudes in a horizontal direction beyond outer sidewalls of both the first support electrode and the second support electrode such that a void is present below the protrusion portion and above a plane extending from bottoms of the first and second support electrodes.

* * * * *